United States Patent [19]

Nakao et al.

[11] Patent Number: 5,592,020
[45] Date of Patent: Jan. 7, 1997

[54] SEMICONDUCTOR DEVICE WITH SMALLER PACKAGE HAVING LEADS WITH ALTERNATING OFFSET PROJECTIONS

[75] Inventors: Mitsuhiro Nakao, Yokohama; Toshimitsu Ishikawa, Kawaguchi; Kazunori Hayashi, Yokohama, all of Japan

[73] Assignee: Kabushiki Kaisha Toshiba, Kawasaki, Japan

[21] Appl. No.: 462,564

[22] Filed: Jun. 5, 1995

Related U.S. Application Data

[63] Continuation of Ser. No. 219,717, Mar. 29, 1994, abandoned.

[30] Foreign Application Priority Data

Apr. 16, 1993 [JP] Japan ................................. 5-090032

[51] Int. Cl.⁶ ......................... H01L 23/48; H01L 23/495
[52] U.S. Cl. ......................... 257/666; 257/692; 257/673
[58] Field of Search ............................ 257/666, 667, 257/672, 676, 735, 773, 692

[56] References Cited

U.S. PATENT DOCUMENTS

| 5,276,352 | 1/1994 | Komenaka et al. | 257/666 |
| 5,309,017 | 5/1994 | Maruyama | 257/676 |
| 5,343,074 | 8/1994 | Higgins et al. | 257/666 |

FOREIGN PATENT DOCUMENTS

| 0486027 | 5/1992 | European Pat. Off. | |
| 63-255953 | 10/1988 | Japan | |
| 1-145842 | 6/1989 | Japan | |
| 2-31454 | 2/1990 | Japan | |
| 3-244149 | 10/1991 | Japan | |
| 5-47819 | 2/1993 | Japan | |
| 5-160333 | 6/1993 | Japan | |

OTHER PUBLICATIONS

Abstract of Publication No. JP63–255953, Patent Abstracts of Japan, vol. 13, No. 74 (1989).
Abstract of Publication No. JP1–145842, Patent Abstracts of Japan, vol. 13, No. 404 (1989).
Abstract of Publication No. JP2–31454, Patent Abstracts of Japan, vol. 14, No. 178 (1990).
Abstract of Publication No. JP3–244149, Patent Abstracts of Japan, vol. 16, No. 31 (1992).
Abstract of Publication No. JP5–47819, Patent Abstracts of Japan, vol. 17, No. 344 (1993).
Abstract of Publication No. JP5–160333, Patent Abstracts of Japan, vol. 17, No. 556 (1993).

Primary Examiner—Mahshid Saadat
Assistant Examiner—Nathan K. Kelley
Attorney, Agent, or Firm—Finnegan, Henderson, Farabow, Garrett & Dunner, L.L.P.

[57] ABSTRACT

Disclosed is a semiconductor device comprising an integrated circuit chip, a first lead having a portion extending substantially in parallel to one side plurality of the chip, and a second lead located adjacent to the first lead. Each of the first and second leads has a recess and a projection continuously. The first lead and second lead are arranged adjacent to each other with the recess and projection of the first lead being in engagement with the projection and recess of the second lead. Bonding wires are bonded on the projection of the first lead and the projection of the second lead. The bonding wires electrically connect the chip to the first lead and also to the second lead.

54 Claims, 17 Drawing Sheets

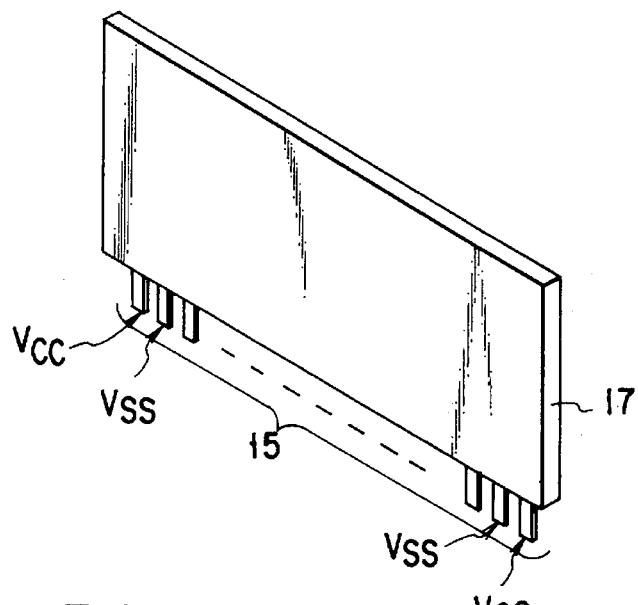
F I G. 3
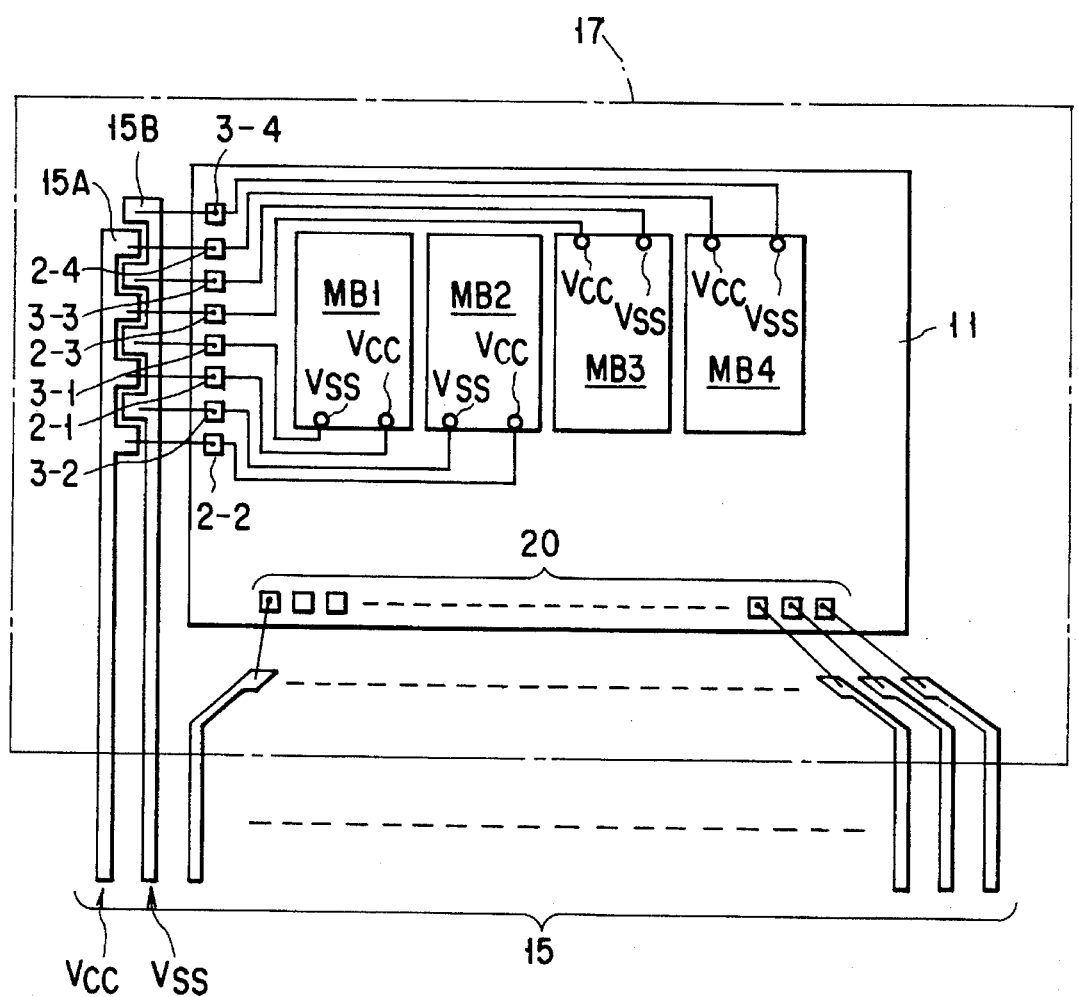
F I G. 4

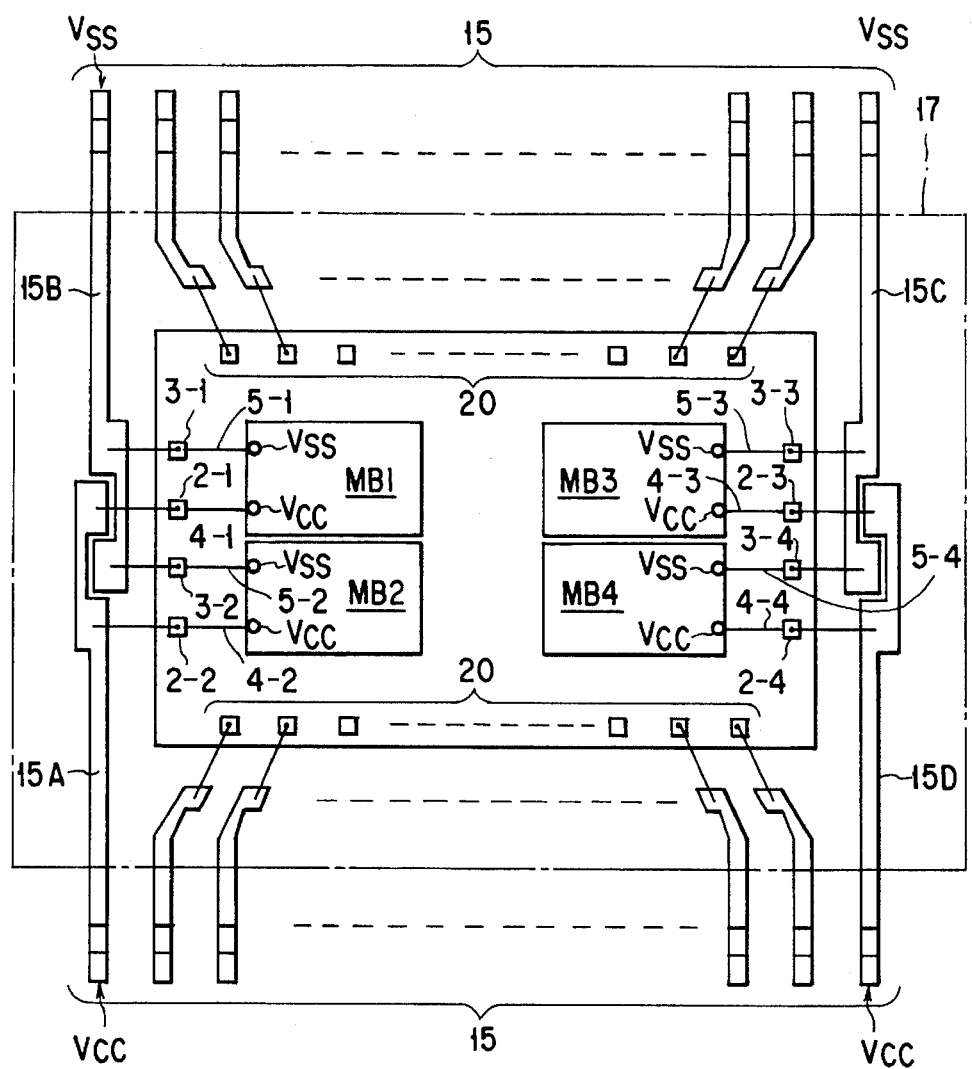
F I G. 5
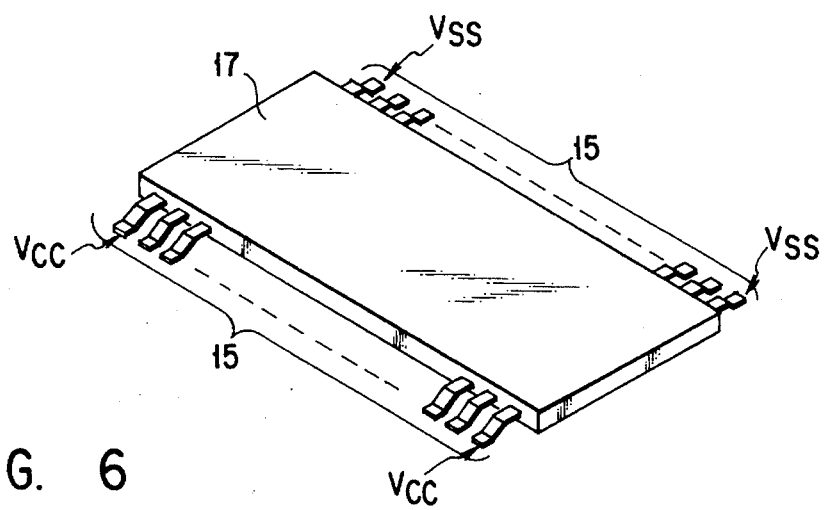
F I G. 6

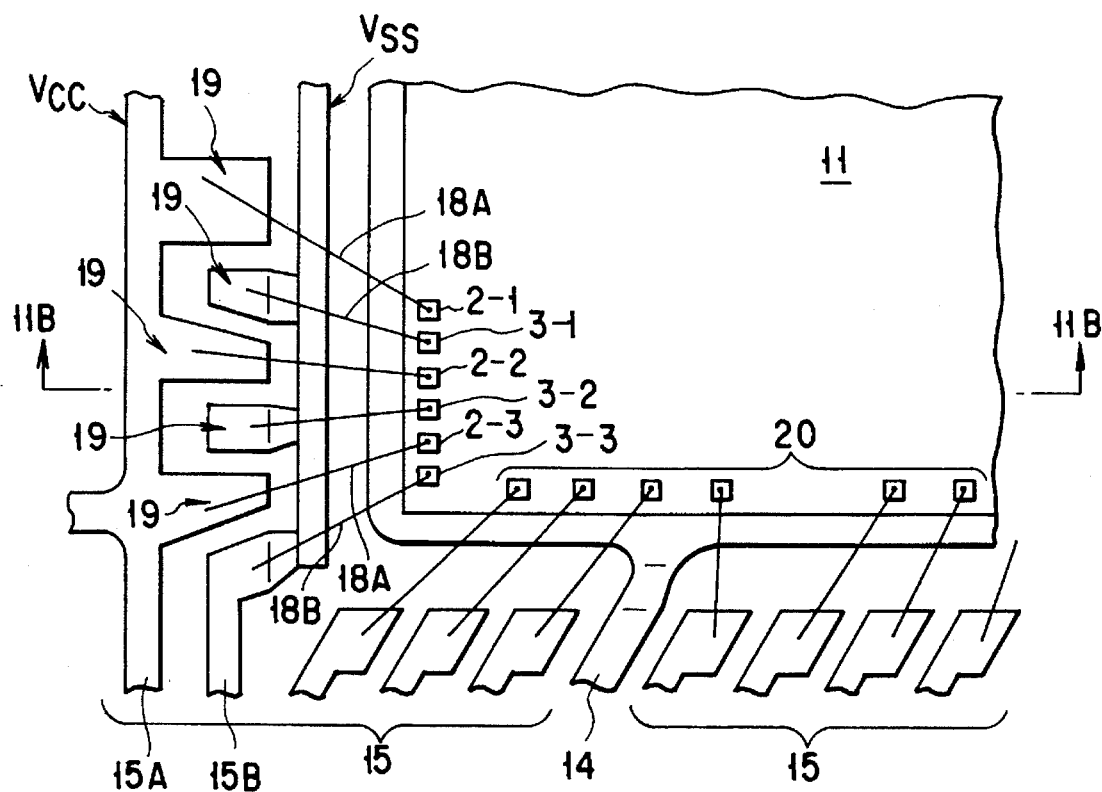
F I G. 11A
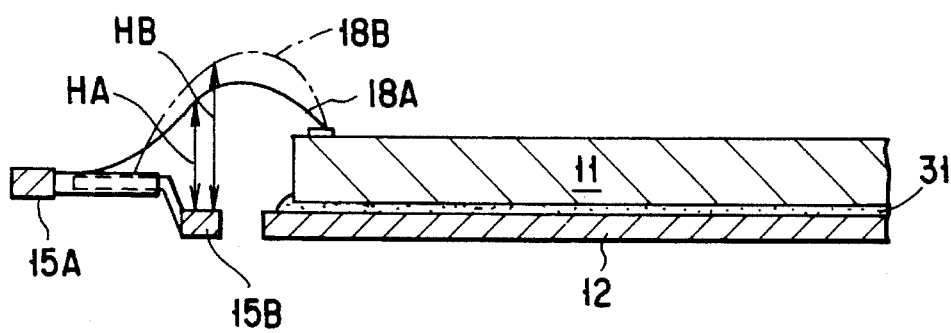
F I G. 11B

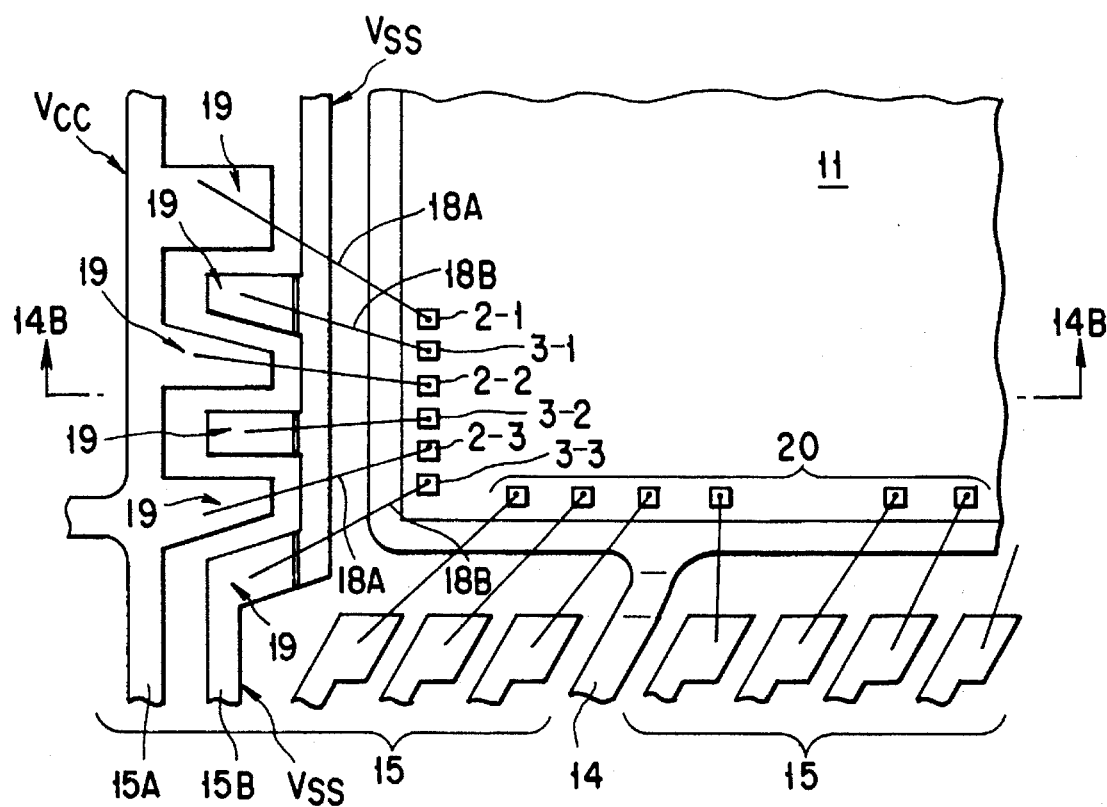
F I G. 14A
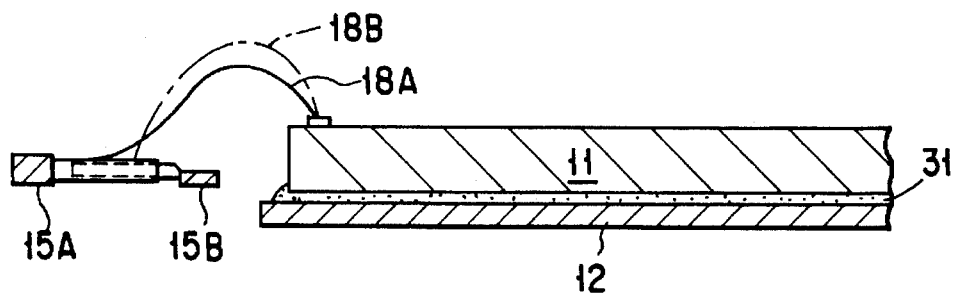
F I G. 14B

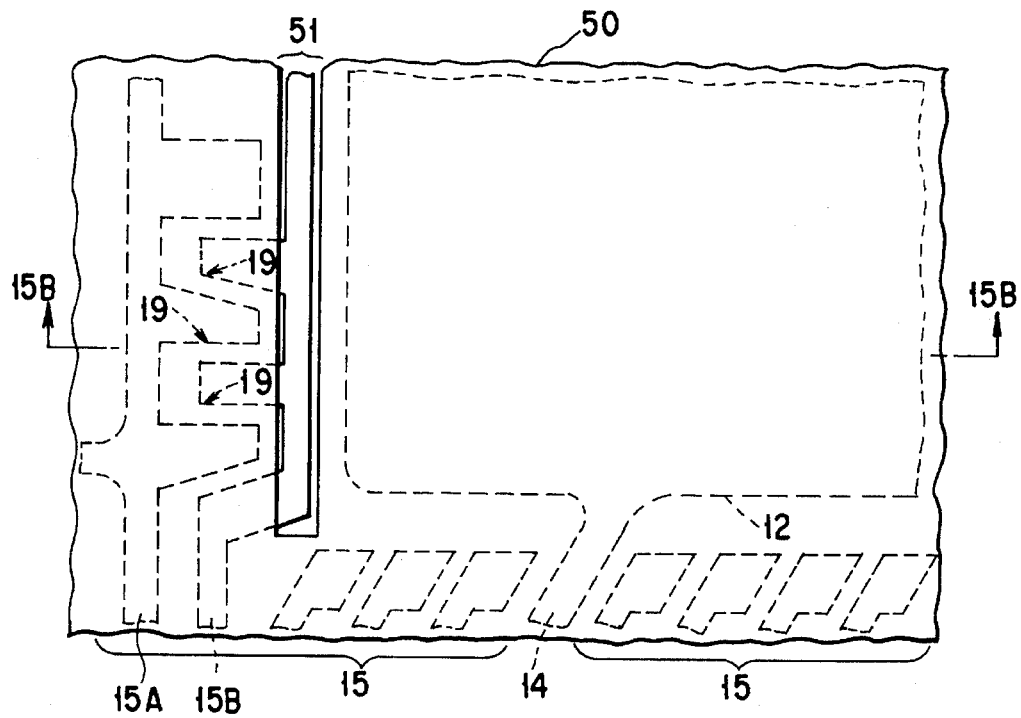
F I G. 15A
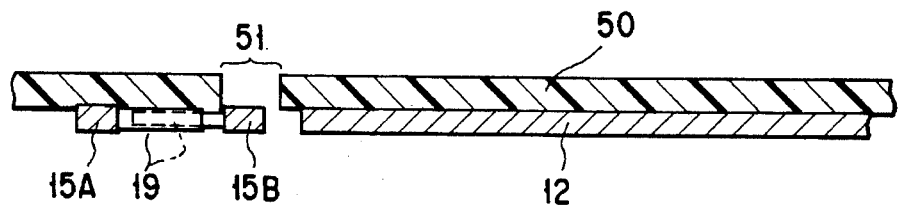
F I G. 15B
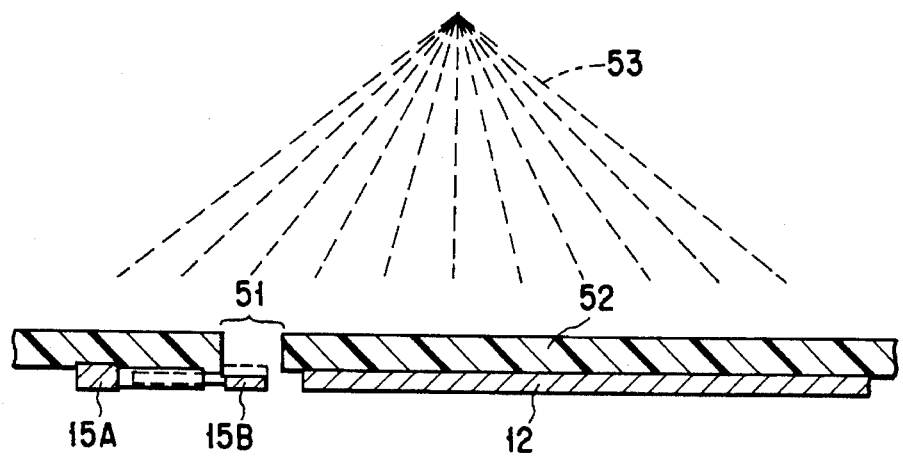
F I G. 16

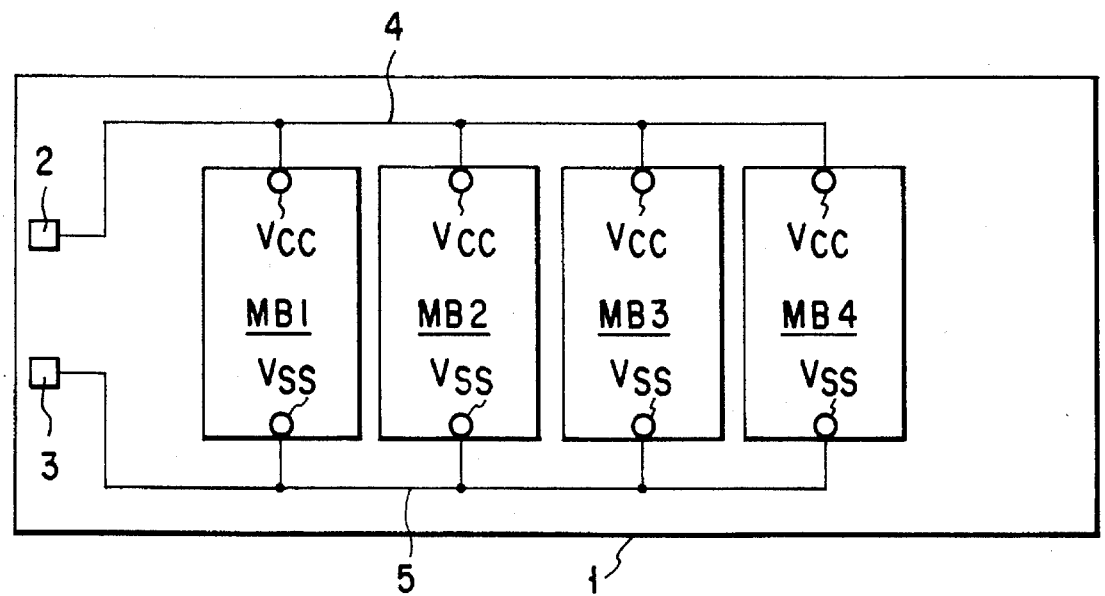
F I G. 23
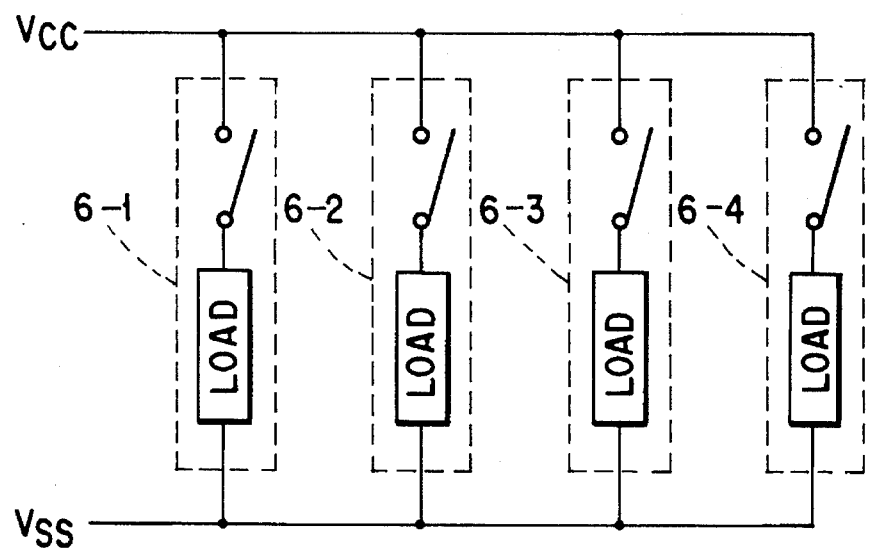
F I G. 24

SEMICONDUCTOR DEVICE WITH SMALLER PACKAGE HAVING LEADS WITH ALTERNATING OFFSET PROJECTIONS

This application is a continuation of application Ser. No. 08/219,717 filed Mar. 29, 1994, now abandoned.

BACKGROUND OF THE INVENTION

1. Field of the Invention

The present invention relates to a semiconductor device, and, more particularly, to a semiconductor device whose inner leads have an improved shape.

2. Description of the Related Art

There is a dynamic RAM which has its memory circuit divided into blocks to improve the processing speed.

FIG. 23 is a structural diagram of a dynamic RAM chip with the memory circuit divided into blocks, and FIG. 24 is a diagram of the equivalent circuit of the RAM chip.

As shown in FIG. 23, a plurality of memory circuit blocks MB1 to MB4 are provided in a semiconductor chip 1. Power supplies are needed to operate the memory circuit blocks MB1 to MB4. Conventionally, one high-potential power supply pad 2 and one low-potential power supply pad 3 are provided at the boundary of the chip 1, with a high-potential power line 4 and a low-potential power line 5 respectively connected to the pads 2 and 3. Those power lines 4 and 5 are connected to the memory circuit blocks MB1 to MB4 to provide a low potential VSS and a high potential VCC required for their operation.

This structure, in the equivalent circuit shown in FIG. 24, has resistor elements 6-1 to 6-4 connected in parallel between the power lines 4 and 5, each resistor element having a series circuit of a switch and a load. The combined resistance in the parallel circuit in this memory circuit varies depending on the ON/OFF status of each switch or the ON/OFF status of each of the memory circuit blocks MB1–MB4, causing a variation in supply voltage.

It is apparent that the integration of the memory circuit blocks MB1–MB4 will be improved and the sensitivities of the elements constituting the memory circuit will be improved accordingly. Even a slight variation in supply voltage may therefore cause the memory circuit blocks MB1–MB4 to malfunction.

SUMMARY OF THE INVENTION

To overcome such a shortcoming, the present inventors attempted to divide the power supply for each memory circuit block.

In the attempt, a single memory circuit block in the equivalent circuit is simply connected in series between the power lines, thus overcoming the problem of the parallel connection to cause a variation in combined resistance. A variation in supply voltage could therefore be suppressed.

The provision of a power supply for each memory circuit block however increases the number of pads. The increasing number of pads inevitably increases the number of leads (number of pins), which requires that the package for a semiconductor chip should be enlarged. The larger package means the enlargement of the semiconductor device, interfering with the down-sizing of secondary products using this semiconductor device, such as computers and word processors. An unnecessary increase in the number of pins affects the easy handling of the semiconductor device.

It is a primary object of the present invention to provide a semiconductor device whose pins will not be increased unnecessarily and which can be housed in a small package.

It is a second object of the present invention to provide a semiconductor device whose pins will not be increased unnecessarily and whose package can be made smaller.

It is a third object of the present invention to provide a semiconductor device whose pins will not be increased unnecessarily, and which can be housed in a small package and incorporates a highly-reliable IC chip that hardly malfunctions.

It is a fourth object of the present invention to provide a semiconductor device whose pins will not be increased unnecessarily, and which is designed to be housed in a small package and to reduce the possible short-circuiting of the inner lead portions.

To achieve the first object, a semiconductor device embodying this invention comprises a semiconductor chip having a plurality of sides and including at least first, second, third and fourth pads serving as outer leads; a first lead member having a portion extending substantially in parallel to one of the plurality of sides; a second lead member located adjacent to the first lead member; a first connection member for electrically connecting the first lead member to the first pad; a second connection member for electrically connecting the second lead member to the second pad; a third connection member for electrically connecting the first lead member to the third pad; and a fourth connection member for electrically connecting the second lead member to the fourth pad.

With this structure, the first and third connection members are commonly connected to the first lead member while the second and fourth connection members are commonly connected to the second lead member. This will prevent the number of pins from unnecessarily increasing and will permit the package of the semiconductor device to be made small.

To achieve the second object, the first and second lead members each have a recess and a projection continuously, and are arranged adjacent to each other with the recess and projection of the first lead member being in engagement with the projections and recesses of the second lead member. The first and third connection members are electrically connected to the projection of the first lead member, and the second and fourth connection members are electrically connected to the projection of the second lead member.

With this structure, since the recess and projection of the first lead member are engaged with the projection and recess of the second lead member, those lead members can be placed adjacent to each other in a narrower area. This permits the package to be made smaller. As the projection is wide, it is possible to secure an area there to connect the connection members to the associated lead member.

To achieve the third object, a plurality of circuit blocks having predetermined functions, high-potential power supply pads and low-potential power supply pads are provided in the IC chip. The power supply pads serve to individually supply different potentials to selected memory circuit blocks among the plurality of memory circuit blocks. One of the high-potential power supply pads is electrically connected to the first lead member by the first connection member, and the other pad is connected to the first lead member by the third connection member. Likewise, one of the low-potential power supply pads is electrically connected to the second lead member by the second connection member, and the other pad is connected to the second lead member by the fourth connection member.

This structure will supply operation supply voltages independently to selected memory circuit blocks while achieving the first object. Accordingly, noise originating from a change in impedance of the other memory circuit blocks will not be superimposed on the supply voltages, so that a a highly-reliable IC chip that hardly malfunctions can be incorporated in the semiconductor device.

To achieve the fourth object, at least the second connection member extends over the first lead member to electrically connect the second lead member to the second pad. An insulating member is provided at least on a portion of the first lead member which underlies the second connection member.

As the insulating member is provided at the portion where the second connection member crosses the first lead member, the second connection member will not easily be short-circuited to the first lead member. This reduces the possible short-circuiting of the inner lead portions.

To achieve the fourth object, according to another aspect, the position of the top surface of the second lead member excluding the projection is shifted from the position of the top surface of the first lead member, away from the first connection member.

As the distance between the second connection member and the first lead member is large, the second connection member and the first lead member will not easily contact with each other. The occurrence of the short-circuiting of the inner lead portions can therefore be reduced.

To achieve the fourth object, the first and second lead members each have a recess and a projection continuously, and are arranged adjacent to each other with the recess and projection of the first lead member being in engagement with the projections and recesses of the second lead member, the first connection member is electrically connected to the projection of the first lead member, and the second connection member is electrically connected to the projection of the second lead member. At least the second connection member extends over the first lead member to electrically connect the second lead member to the second pad. The connecting point between the projection of the first lead member and the first connection member and the connecting point between the projection of the second lead member and the second connection member are positioned on an imaginary straight line.

With this structure, the first and second connection members will have nearly the same length, ensuring nearly the same loop diameter. As the loop diameters become nearly equal to each other, the loops will have the same height. As a result, the distance between the second connection member and the first connection member increases, making it difficult to short-circuit the second lead member and the first lead member. The occurrence of the short-circuiting of the inner lead portions can therefore be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a perspective view of the semiconductor device according to the first embodiment;

FIG. 4 is a plan view of a semiconductor device according to a second embodiment of this invention;

FIG. 5 is a plan view of a semiconductor device according to a third embodiment of this invention;

FIG. 6 is a perspective view of the semiconductor device according to the third embodiment;

FIG. 11A is a plan view of a semiconductor device according to a sixth embodiment of this invention;

FIG. 11B is a cross section taken along the line 11B—11B in FIG. 11A;

FIG. 14A is a plan view of a semiconductor device according to an eighth embodiment of this invention;

FIG. 14B is a cross section taken along the line 14B—14B in FIG. 14A;

FIG. 15A is a cross-sectional view during fabrication of the semiconductor device according to the eighth embodiment;

FIG. 15B is a cross section taken along the line 15B—15B in FIG. 15A;

FIG. 16 is a plan view during fabrication of the semiconductor device according to the eighth embodiment;

FIG. 23 is a structural diagram of a typical dynamic RAM chip; and

FIG. 24 shows an equivalent circuit of the typical dynamic RAM chip.

DETAILED DESCRIPTION OF THE PREFERRED EMBODIMENTS

Figure 1:
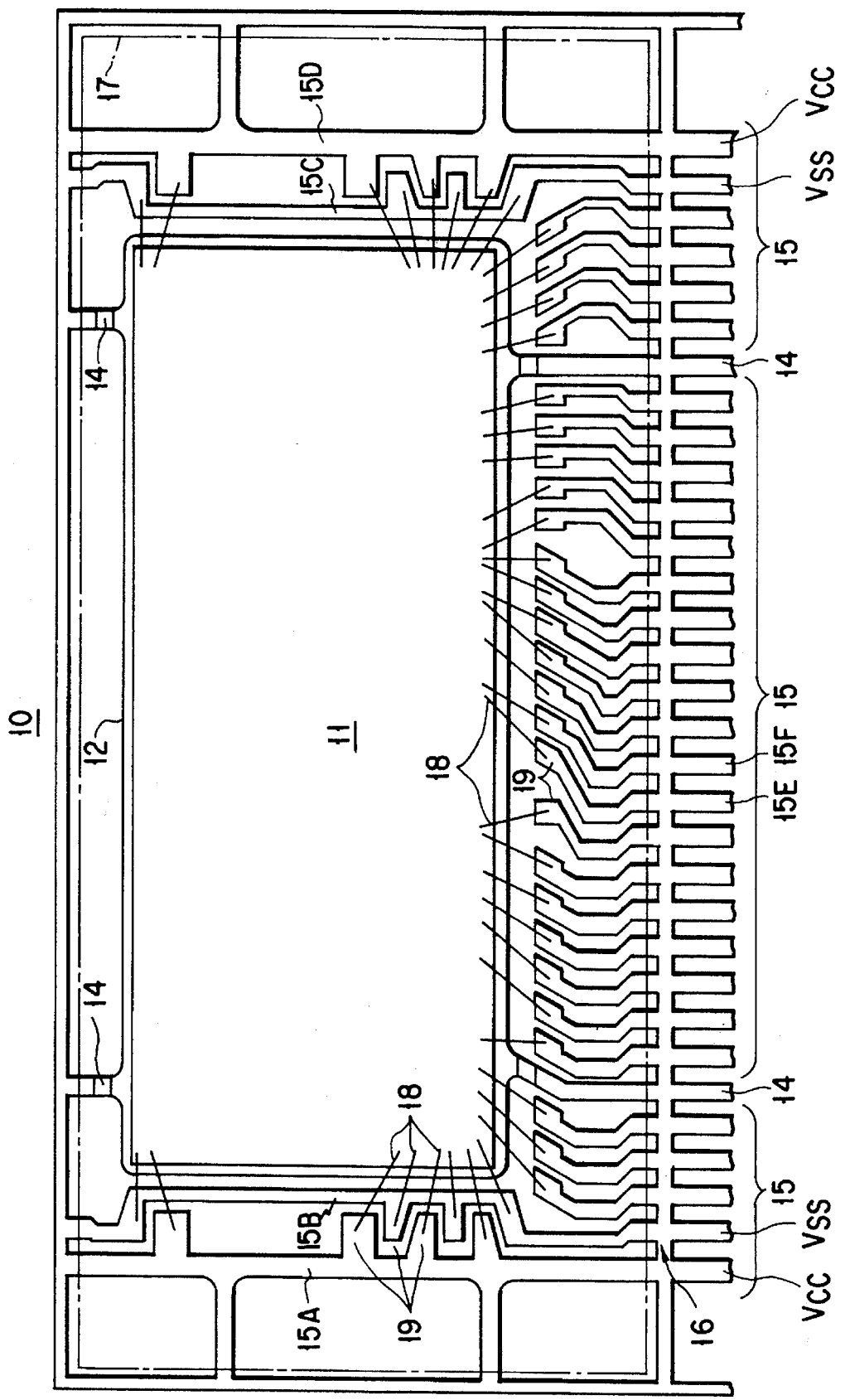
FIG. 1 is a plan view of a semiconductor device according to a first embodiment of the present invention.

Preferred embodiments of the present invention will now be described referring to the accompanying drawings. Same reference numerals will be given to corresponding or identical portions of different embodiments throughout the following description to avoid their redundant description.

Figure 2:
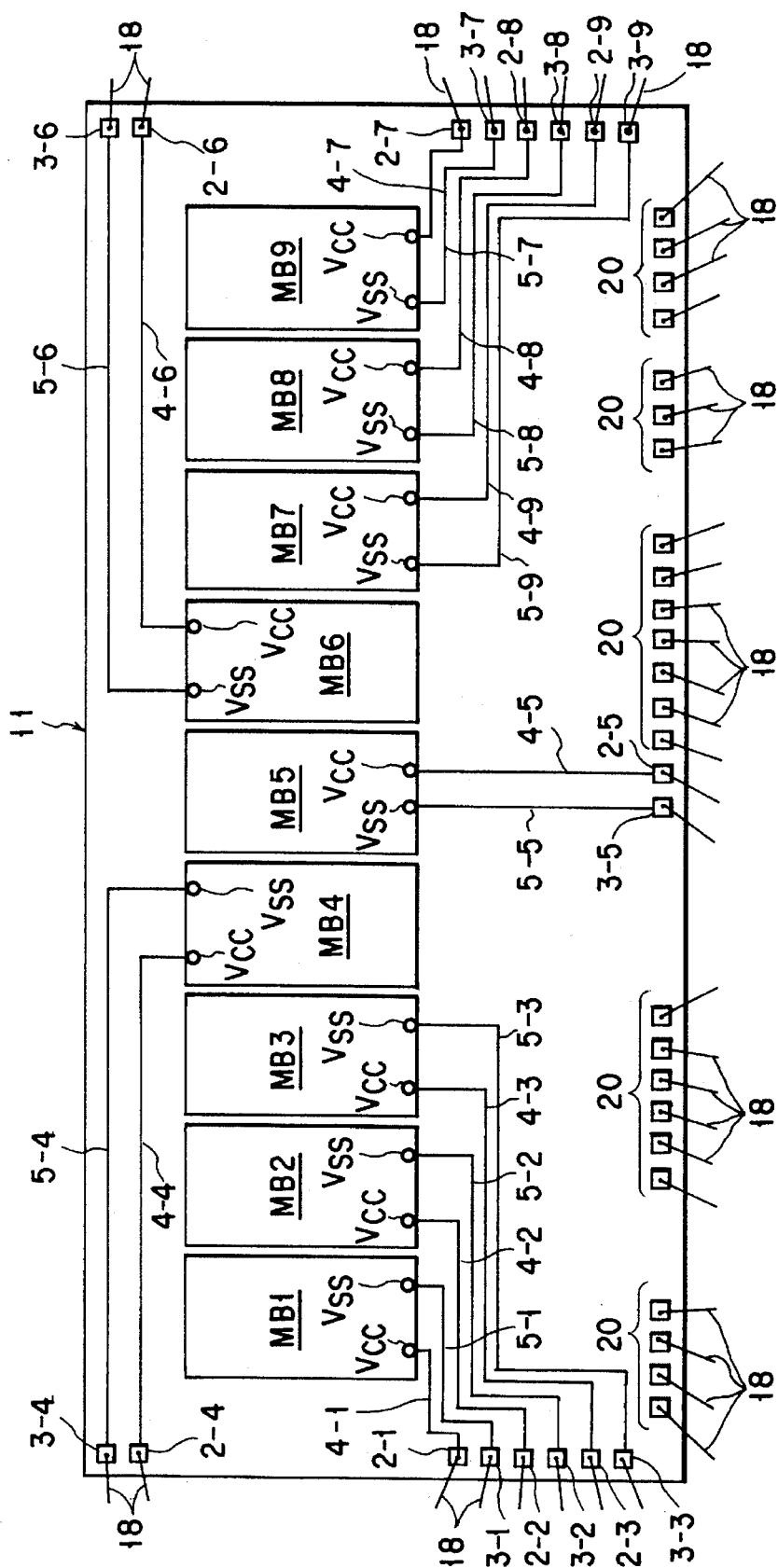
FIG. 2 is a structural diagram of a dynamic RAM chip of the semiconductor device according to the first embodiment.

FIG. 1 is a plan view of a semiconductor device according to a first embodiment of the present invention, FIG. 2 is a block diagram showing the schematic structure of a dynamic RAM chip shown in FIG. 1, and FIG. 3 is a perspective view of the semiconductor device after packaged. FIG. 1 shows a chip mounted on a lead frame.

As shown in FIG. 1, a metal lead frame 10 mainly comprises a bed 12 on which a chip 11 is mounted, tie bars 14 for linking the bed 12 to the frame 10, leads 15 which later serve as pins, and a dam bar 16 for preventing resin from leaking out from the clearance between the leads 15 at the time the resin is sealed. Reference numeral "17" denotes a mold resin that is formed later to seal the chip. After the chip 11 is sealed with the mold resin 17, the dam bar 16 is cut and outer leads are cut and formed, yielding a SIP (Single In-line package) type semiconductor device as shown in FIG. 3. This semiconductor device will be supplied to the market.

That portion of the lead 15 which is fitted in the mold resin 17 is generally called an "inner lead" while the portion which comes out of the mold resin 17 is called an "outer lead." The outer leads extending outside the mold resin 17 later serve as external pins (see FIG. 3).

Each inner lead portion is provided with a bonding area 19 where a bonding wire 18 is to be bonded. The width of the inner lead at the bonding area 19 is wider than the other portion to ensure wire bonding.

Of the leads 15, leads 15A, 15B and 15C and 15D located at the edges, unlike the other leads, extend parallel to the sides of the ship 11. A high potential VCC is applied to the outermost leads 15A and 15D closest to the edges. A low potential VSS (e.g., ground potential) is applied to the lead 15B adjacent to the lead 15A, and a low potential VSS (e.g., ground potential) is applied to the lead 15C adjacent to the lead 15D. Accordingly, after the chip 11 shown in FIG. 1 is sealed with resin, the high potential VCC is applied to the outermost pins while the low potential VSS is applied to the pins adjacent to the outermost pins, as shown in FIG. 3.

Each of the leads 15A–15D is notched, so that each of the leads 15A–15D has a plurality of recesses and a plurality of projections formed alternately and continuously. The projections of each of the leads 15A–15D is wider than the other portion thereof, and the bonding area 19 is provided on that projection. The projections and recesses of the lead 15B engage respectively with the recesses and projections of the adjoining lead 15A. Likewise, the projections and recesses of the lead 15C engage respectively with the recesses and projections of the adjoining lead 15D.

One ends of the bonding wires 18 are connected to the respective projections and the respective bonding areas 19 located at the distal ends of the inner leads, and the other ends connected to pads 2-1 to 2-9, 3-1 to 3-9 and 20 provided along the along the edges of the chip 11 (see FIG. 2).

As shown in FIG. 2, a plurality of dynamic memory circuit blocks MB1 to MB9 are provided in the chip 11. Power supplies for operating the memory circuit blocks MB1–MB9 are provided separately block by block.

In the semiconductor device according to this invention, to provide a power supply for each memory circuit block, high-potential (VCC) power supply pads 2-1 to 2-9 and low-potential (VSS) power supply pads 3-1 to 3-9 are provided in association with the memory circuit blocks MB1–MB9.

The high-potential power supply pads 2-1 to 2-9 are connected to the respective memory circuit blocks MB1–MB9 via high-potential power lines 4-1 to 4-9. The low-potential power supply pads 3-1 to 3-9 are connected to the respective memory circuit blocks MB1–MB9 via low-potential power lines 5-1 to 5-9.

The high-potential power supply pads 2-1 to 2-4 are electrically connected to the lead 15A via the bonding wires 18, and the high-potential power supply pads 2-6 to 2-9 are electrically connected to the lead 15D via the bonding wires 18. The high-potential power supply pad 2-5 is electrically connected to another lead 15F (see FIG. 1) via the bonding wire 18.

The low-potential power supply pads 3-1 to 3-4 are electrically connected to the lead 15B via the bonding wires 18, and the low-potential power supply pads 3-6 to 3-9 are electrically connected to the lead 15C via the bonding wires 18. The low-potential power supply pad 3-5 is electrically connected to another lead 15E (see FIG. 1) via the bonding wire 18.

It is desirable that power supply to the memory circuit blocks MB1–MB9 be accomplished using the leads 15A, 15B, 15C and 15D as much as possible to suppress an increase in the number of pins. If there is some restrictions like the circuit layout in the chip 11 being difficult, the power supply to the memory circuit blocks MB1–MB9 may be accomplished using the leads 15E and 15F as per the first embodiment. In this case too, the leads 15A and 15B are shared by the memory circuit blocks MB1–MB4 and the leads 15C and 15D are shared by the memory circuit blocks MB6–MB9, so that an unnecessary increase in the number of pins can be avoided.

A plurality of pads denoted by reference numeral "20" in FIG. 2 include signal input/output pads and high-potential/ low-potential power supply pads for providing supply voltages necessary to operate the peripheral circuits (not shown). The details of the input signals, output signals and the peripheral circuits will not be given in this specification.

A second embodiment of this invention will now be described.

FIG. 4 is a plan view schematically showing a semiconductor device according to the second embodiment.

In the semiconductor device described above referring to FIGS. 1 through 3, the leads 15A and 15B each having recesses and projections formed continuously extend along one side of the chip 11, and the leads 15C and 15D each having recesses and projections formed continuously extend along the opposite side of the chip 11.

The leads 15C and 15D may be eliminated and the leads 15A and 15B each having recesses and projections formed continuously may be formed to extend along only one side of the chip 11, as shown in FIG. 4.

The second embodiment with the above structure will have the same advantages as the first embodiment.

A third embodiment of this invention will be described below.

FIG. 5 is a plan view of a semiconductor device according to the third embodiment of the present invention, and FIG. 6 is a perspective view of the semiconductor device after packaged.

The semiconductor devices of the first and second embodiments described with reference to FIGS. 1 through 4 are both SIP semiconductor devices.

Those semiconductor devices may be modified to be an SOP (Small Out-line Package) type or DIP (Dual In-line Package) type in which external pins are led out from opposite sides of the mold resin 17.

In this embodiment, the lead 15A which is applied with the high potential VCC and the lead 15B which is applied with the low potential VSS are led out in the opposite directions. Similarly, the leads 15D and 15C are led out in the opposite directions.

Figure 7:
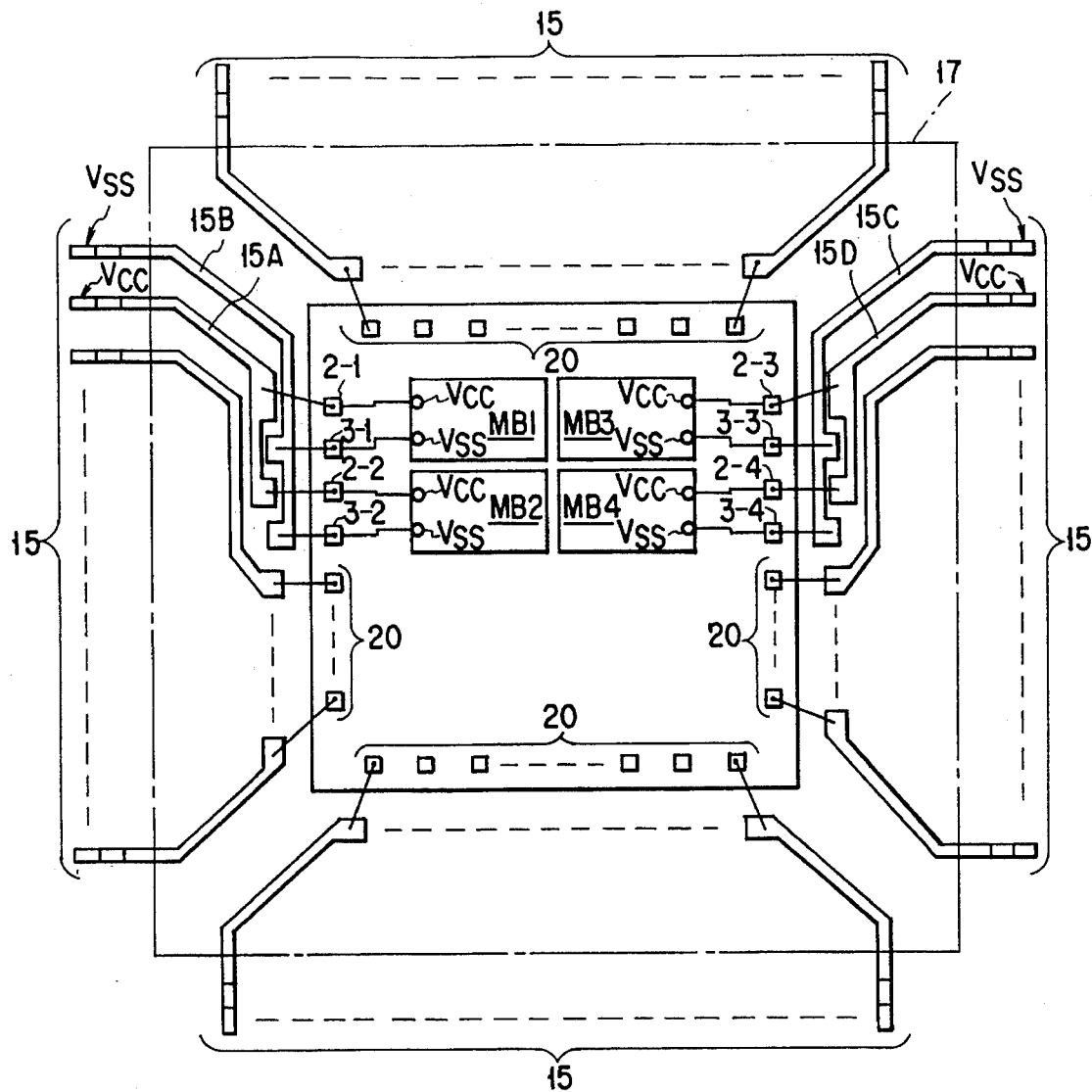
FIG. 7 is a plan view of a semiconductor device according to a fourth embodiment of this invention.
Figure 8:
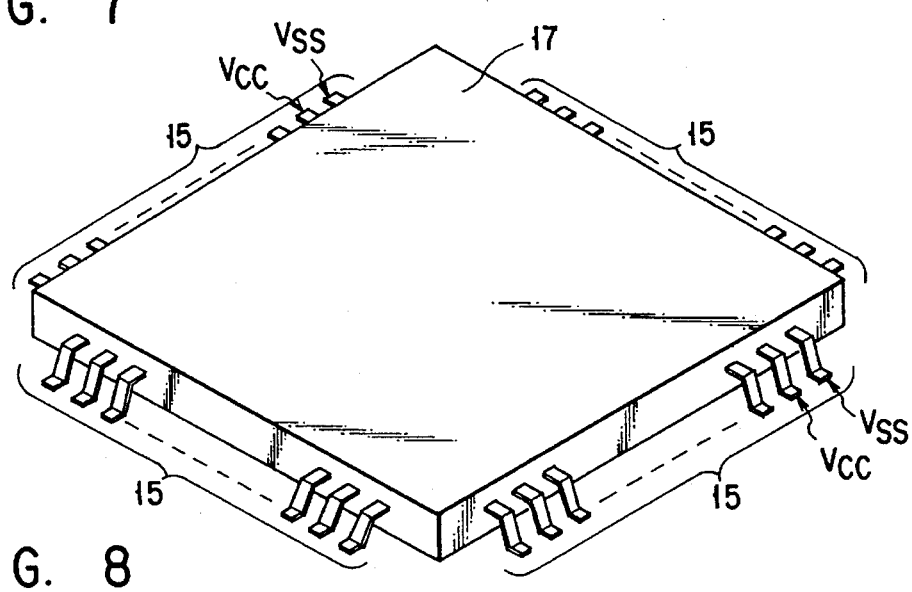
FIG. 8 is a perspective view of the semiconductor device according to the fourth embodiment.

FIG. 7 is a plan view of a semiconductor device according to a fourth embodiment of the present invention, and FIG. 8 is a perspective view of this semiconductor device after packaged.

The semiconductor device embodying this invention may be modified to be a QFP (Quad Flat Package) type having pins provided in four directions, as well as an SIP type and DIP type.

A fifth embodiment of this invention will be described below.

Figure 9A:
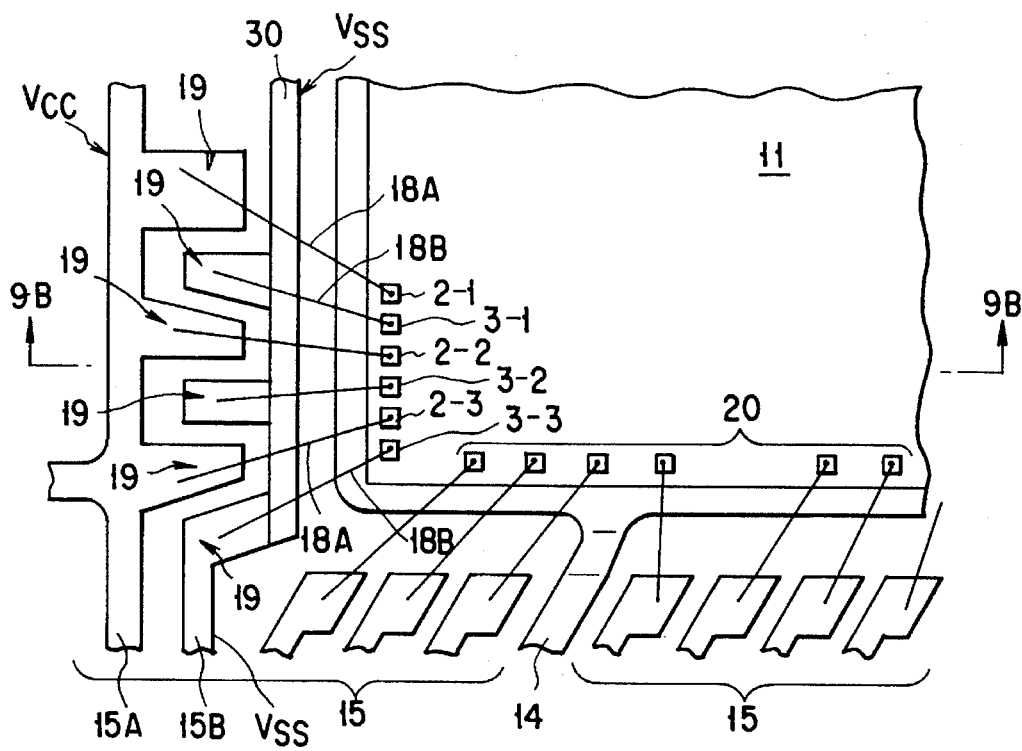
FIG. 9A is a plan view of a semiconductor device according to a fifth embodiment of this invention.
Figure 9B:
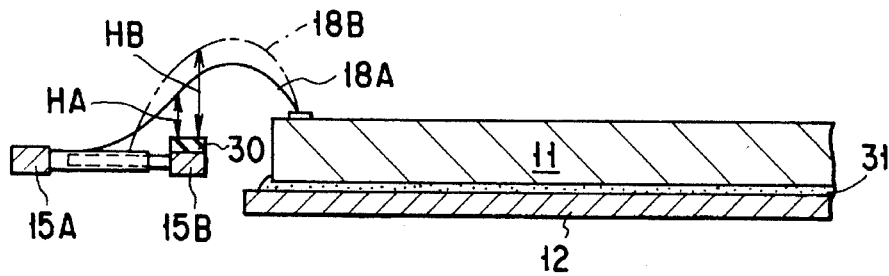
FIG. 9B is a cross section taken along the line 9B—9B in FIG. 9A.

FIGS. 9A and 9B show a semiconductor device according to the fifth embodiment of this invention, FIG. 9A being a plan view showing the essential portions in enlargement and FIG. 9B being a cross section taken along the line 9B—9B in FIG. 9A.

As shown in FIGS. 9A and 9B, the lead 15B is located between the lead 15A and the chip 11. One ends of the bonding wires 18A are connected to the high-potential power supply pads 2-1 to 2-3, and the other ends connected to the bonding areas 19 provided on the projections of the lead 15A. At this time, the bonding wires 18A run over the lead 15B. One ends of the bonding wires 18B are connected to the low-potential power supply pads 3-1 to 3—3, and the other ends connected to the bonding areas 19 provided on the projections of the lead 15B. An insulating layer 30 is formed on the lead 15B. The insulating layer 30 is provided in association with the area where the bonding wires 18A run over. In this embodiment, the insulating layer 30 is provided in the portion of the lead 15B which faces the chip 11 and excludes the projections.

In FIG. 9B, an adhesive layer 31 serves to adhere the chip 11 on the bed 12.

In this device, the bonding length of the wire 18A is longer than that of the wire 18B. In the wire bonding, as the wire bonding length increases, the loop heights HA and HB become gradually lower. The lower the loop heights HA and HB become, the greater the chance that the wires would flow by the mold resin at the time of molding so that the wires contact the leads. This possibility would increase particularly for devices which are designed to have narrower pitches between leads or narrower pitches between pads to increase the number of pins while suppressing an increase in package size. If the device according to this invention is of this type, the loop height HA of the wire 18A is lower than the loop height HB of the wire 18B, thus increasing the chance of the wire 18A contacting the lead 15B.

In a device having the insulating layer 30 on the lead 15B as shown in FIGS. 9A and 9B, even if the wire 18A moves to contact the lead 15B by the mold resin, the existence of the insulating layer 30 on the lead 15B prevents the wire 18A and the lead 15B from being short-circuited.

Figure 10:
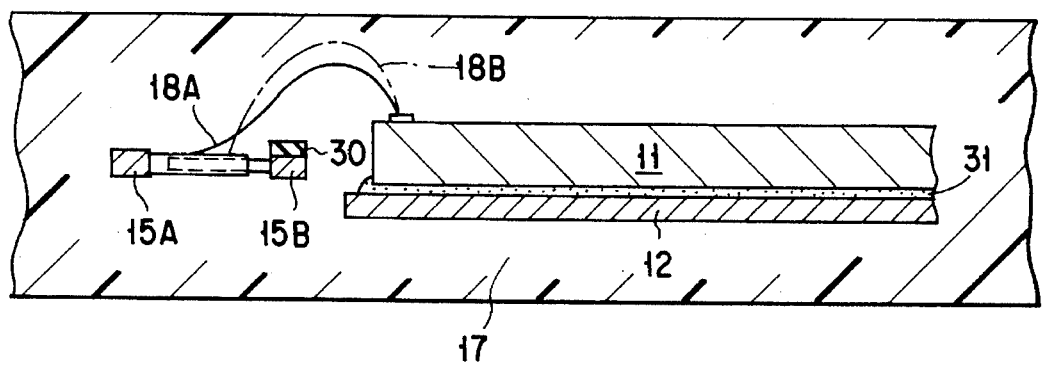
FIG. 10 is a cross section of the semiconductor device according to the fifth embodiment after packaged.

The insulating layer 30 shown in FIGS. 9A and 9B is formed by coating an insulating material on the lead 15B before wire bonding or adhering an insulating tape thereon. After packaging, therefore, the insulating layer 30 made of an insulating material other than the mold resin 17 is located on the lead 15B as shown in FIG. 10.

A sixth embodiment of this invention will be described below.

FIGS. 11A and 11B show a semiconductor device according to the sixth embodiment of this invention, FIG. 11A being a plan view showing the essential portions in enlargement and FIG. 11B being a cross section taken along the line 11B—11B in FIG. 11A.

As shown in FIGS. 11A and 11B, the lead 15B located between the outermost lead 15A and the chip 11, excluding the projections is pushed downward away from the bonding wires 18A and 18B. Consequently, the lead 15B excluding the projections is positioned lower than the surface of the bonding area 19 provided on that projection.

In the semiconductor device with the above structure, as the lead 15B excluding the projections is placed away from the wires 18A and 18B, the loop height HA of the wire 18A can be increased. The chance of the wire 18A contacting the lead 15B can be reduced as per the fifth embodiment. It is therefore possible to prevent the short-circuiting from occurring by the contact of the wire 18A with the lead 15B.

The lead 15B having a shape as shown in FIGS. 11A and 11B may be formed by depressing the lead 15B at the same time as the bed 12 in the depressing step for the bed 12 which is carried out to make the package as thin as possible.

A seventh embodiment of this invention will be described below.

Figure 12A:
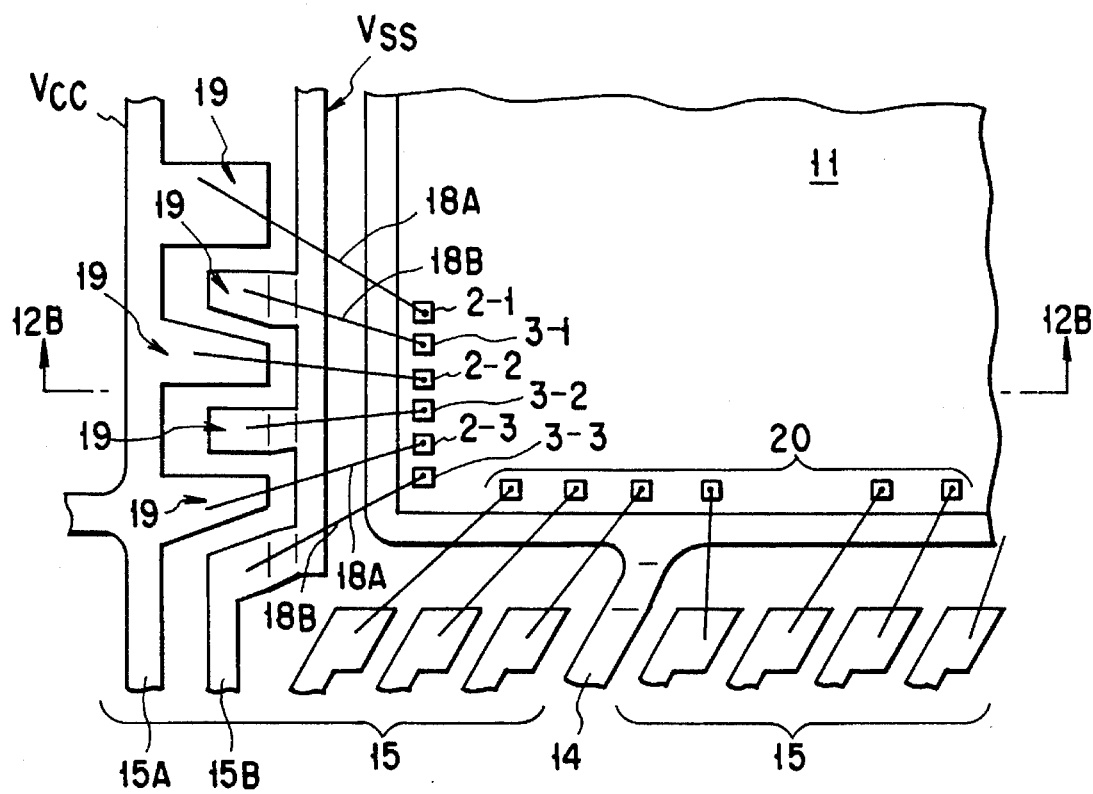
FIG. 12A is a plan view of a semiconductor device according to a seventh embodiment of this invention.
Figure 12B:
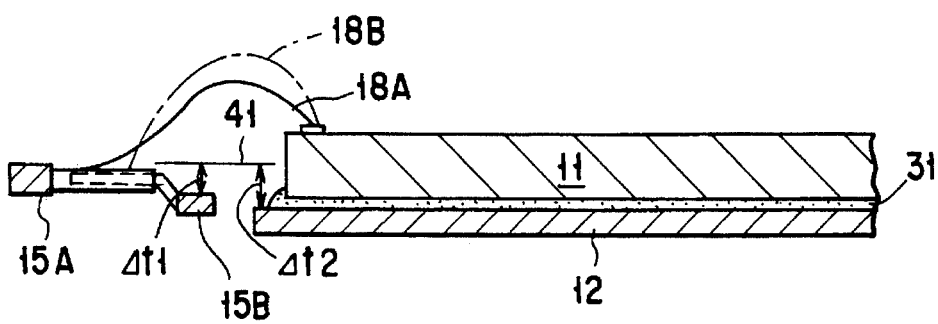
FIG. 12B is a cross section taken along the line 12B—12B in FIG. 12A.

FIGS. 12A and 12B show a semiconductor device according to the seventh embodiment of this invention, FIG. 12A being a plan view showing the essential portions in enlargement and FIG. 12B being a cross section taken along the line 12B—12B in FIG. 12A.

As shown in FIGS. 12A and 12B, the device according to the seventh embodiment is similar to the one shown in FIGS. 11A and 11B. The difference lies in that the surface position of the lead 15B excluding the projections comes between the surface position of the lead 15A and the surface position of the bed 12. FIG. 12B shows a straight line 41 representing the surface position of the lead 15A. The distance between the line 41 to the surface position of the lead 15B excluding the projections is $\Delta t1$, and the distance from the line 41 to the surface position of the bed 12 is $\Delta t2$. The distance $\Delta t1$ is shorter than $\Delta t2$.

The device with the above structure can prevent the lead 15B from being badly deformed or broken, as well as can prevent the short-circuiting between the lead 15B and the wires 18A and 18B.

The lead 15B is not supported on the frame in the direction along the line 12B—12B in FIG. 12A. FIG. 1 which has already been discussed shows the details. Suppose the lead 15B is depressed at the same time as the bed 12 using such a lead frame. If the depressed amount of the bed 12 is larger than that of the lead 15B, the lead 15B does not have a support along the line 12B—12B at the pressing time and is pulled toward the bed 12. This tension deforms the lead 15 badly, causing necking or breaks the lead 15B at the worst.

A method of fabricating a semiconductor device according to the seventh embodiment will now be described.

Figure 13A:
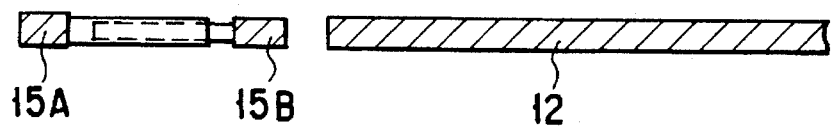
FIGS. 13A through 13C are cross-sectional views during fabrication of the semiconductor device according to the seventh embodiment.
Figure 13B:
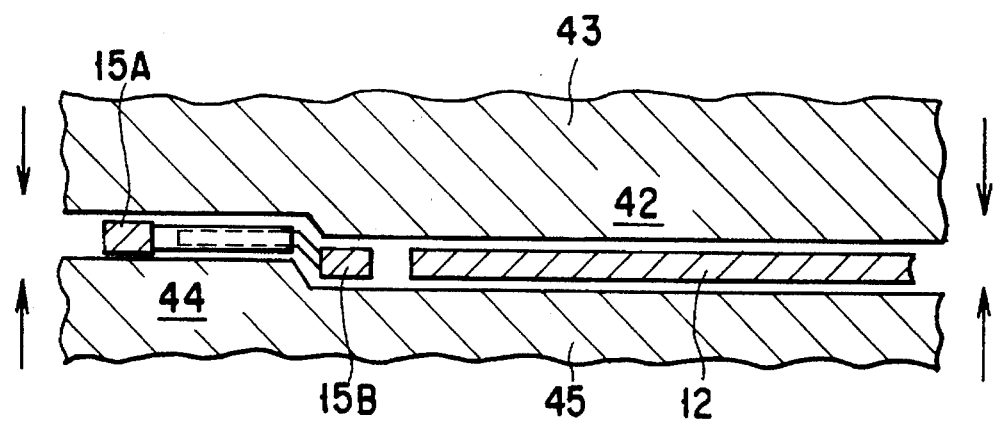
Figure 13C:
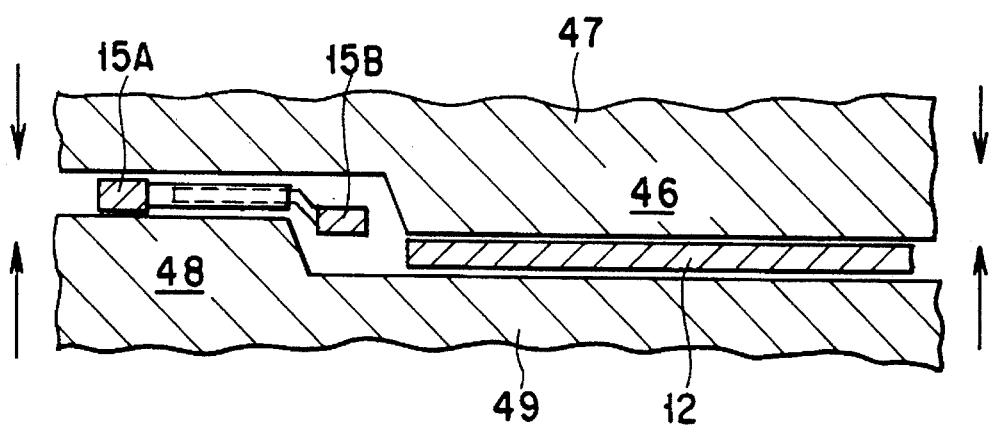

FIGS. 13A to 13C are cross sections during fabrication of the semiconductor device according to the seventh embodiment.

FIG. 13A shows a lead frame before depression.

The lead frame as shown in FIG. 13A is pressed with an upper mold 43 having a punch 42 for pressing the bed 12 and the lead 15B excluding the projections and a bottom mold 45 having a punch 44 for lifting only the lead 15A including the projections and the projections of the lead 15B, as shown in FIG. 13B.

Next, with the pressing mold changed, the lead frame is pressed again with an upper mold 47 having a punch 46 for further pressing only the bed 12 and a bottom mold 49 having a punch 48 for lifting only the lead 15A including the projections and the projections of the lead 15B.

As the pressing of the lead frame is separated to two steps: a first step with a small pressing amount followed by a second step with a larger pressing amount for depressing only the bed 12. It is possible to prevent the lead 15B from being badly deformed or broken.

An eight embodiment of this invention will be described below.

FIGS. 14A and 14B show a semiconductor device according to the eight embodiment of this invention, FIG. 14A being a plan view showing the essential portions in enlargement and FIG. 14B being a cross section taken along the line 14B—14B in FIG. 14A.

As shown in FIGS. 14A and 14B, the device according to the eighth embodiment is designed for the same purpose as that of the devices according to the fifth to seventh embodiments, i.e., to prevent short-circuiting between the lead 15B and the wires 18A and 18B.

As shown in FIGS. 14A and 14B, the surface of the lead 15B excluding the projections is etched out away from the wires 18A and 18B.

As the portion of the lead 15B excluding the projections is set apart from the wires 18A and 18B, the device with this structure, like the fourth embodiment, can prevent the short-circuiting of the wire 18A and the lead 15B.

A method of fabricating a semiconductor device according to the eighth embodiment will now be described.

FIG. 15A is a plan view during fabrication of the semiconductor device according to the eighth embodiment, and FIG. 15B is a cross section taken along the line 15B—15B in FIG. 15. FIG. 16 is a cross section during fabrication of the semiconductor device according to the eighth embodiment.

First, a masking tape having an opening 51 corresponding to the portion of the lead 15B excluding the projections is stuck on the top surface of the lead frame. Then, an etching liquid 53 is sprayed as shown in FIG. 16. The etching liquid 53 reaches the surface of the lead 15B via the opening 51, etching only the top surface of the lead 15B excluding the projections. This method forms the lead frame as shown in FIGS. 14A and 14B.

A ninth embodiment of this invention will be described below.

Figure 17A:
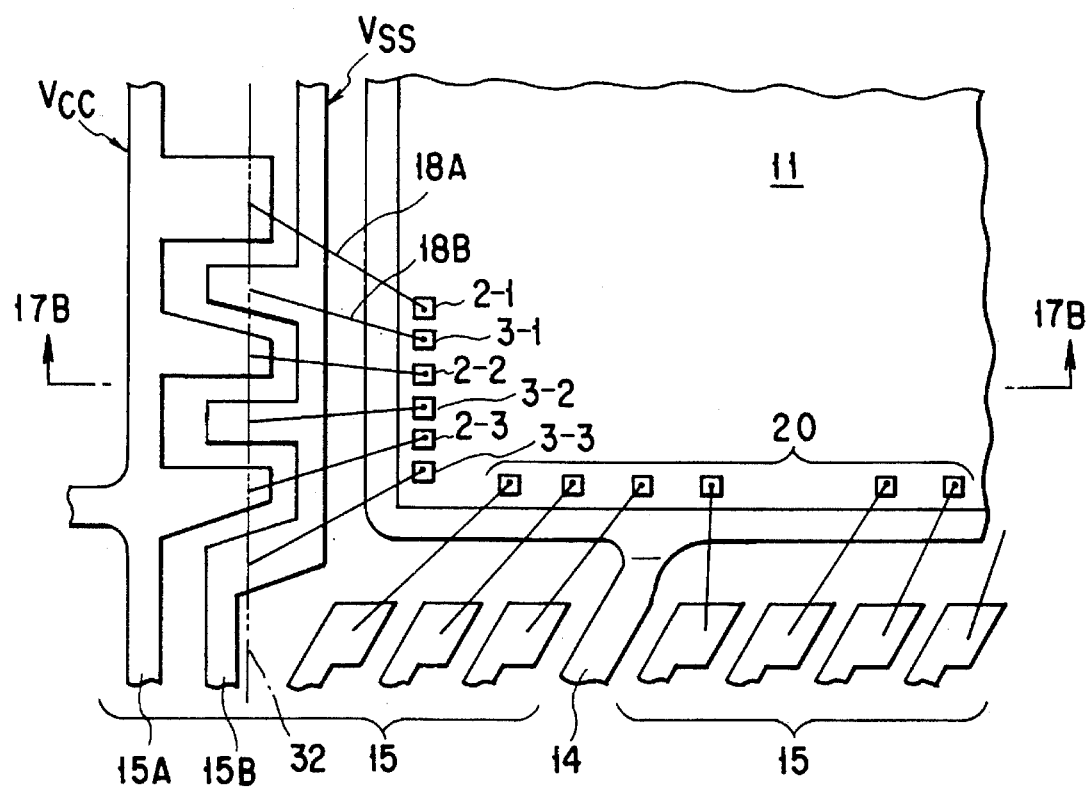
FIG. 17A is a plan view of a semiconductor device according to a ninth embodiment of this invention.
Figure 17B:
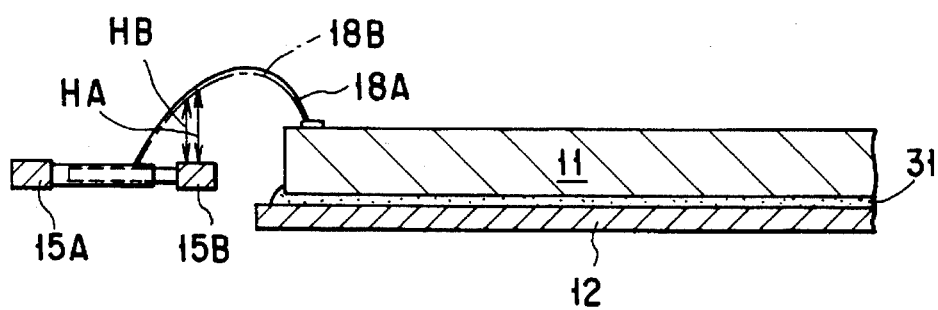
FIG. 17B is a cross section taken along the line 17B—17B in FIG. 17A.

FIGS. 17A and 17B show a semiconductor device according to the ninth embodiment of this invention, FIG. 17A being a plan view showing the essential portions in enlargement and FIG. 17B being a cross section taken along the line 17B—17B in FIG. 17A.

In the semiconductor devices according to the first to eighth embodiments, the leads 15A and 15B each have recesses and projections formed continuously, and the leads 15A and 15B are arranged adjacent to each other with the recesses and projections of the lead 15A being engaged with the projections and recesses of the lead 15B.

In the semiconductor devices having such a structure, the connecting positions between the bonding areas 19 and the wires 18A and 18B can be set on one imaginary line 32 as shown in FIGS. 17A and 17B.

When the connecting positions are set on the single imaginary lien 32, the wires will have nearly uniform bonding lengths. The uniform bonding length reduces a variation in loop heights HA and HB of the wires, thus reducing the chance of causing the wire 18A connected to the lead 15A to contact the lead 15B. Like the fourth to eighth embodiments, the ninth embodiment can prevent the short-circuiting of the wire 18A and the lead 15B.

The connection of the wires 18A and 18B shown in FIGS. 17A and 17B can be accomplished in all the semiconductor devices of the first to eighth embodiments.

A tenth embodiment of this invention will be described below.

Figure 18A:
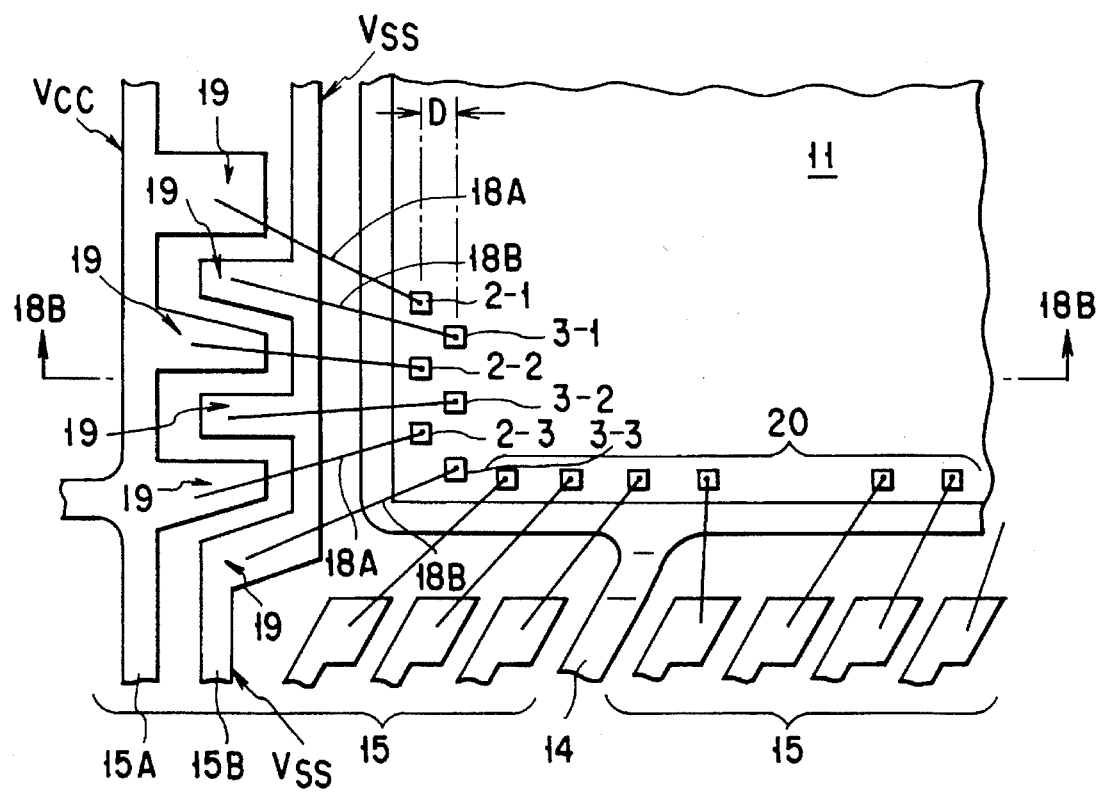
FIG. 18A is a plan view of a semiconductor device according to a tenth embodiment of this invention.
Figure 18B:
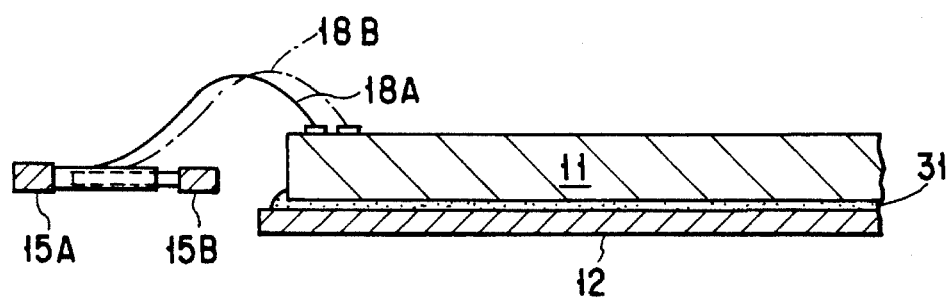
FIG. 18B is a cross section taken along the line 18B—18B in FIG. 18A.

FIGS. 18A and 18B show a semiconductor device according to the tenth embodiment of this invention, FIG. 18A being a plan view showing the essential portions in enlargement and FIG. 18B being a cross section taken along the line 18B—18B in FIG. 18A.

The first lead 15A and second lead 15B of the device according to this invention each have recesses and projections formed continuously. Unless the system explained in the section of the ninth embodiment (see FIGS. 17A and 17B) is employed positively, the bonding positions of the wire 18A would be shifted from the bonding position of the wire 18B, so that the length of the wire 18A would differ from that of the wire 18B.

In the device according to the tenth embodiment, the wires 18A and 18B will have nearly the same length using a different system from that of the ninth embodiment.

The positions where the high-potential pads 2-1 to 2-3 on the chip 11 are shifted from the positions where the low-potential pads 3-1 to 3—3 are formed as shown in FIGS. 18A and 18B. The former pads are separated from the latter pads by a distance D in FIG. 18A.

The wires 18A and 18B will have nearly the same length by shifting the bonding positions on the chip side, i.e., shifting the positions of the high-potential pads from the positions of the low-potential pads.

A eleventh embodiment of this invention will be described below.

Figure 19:
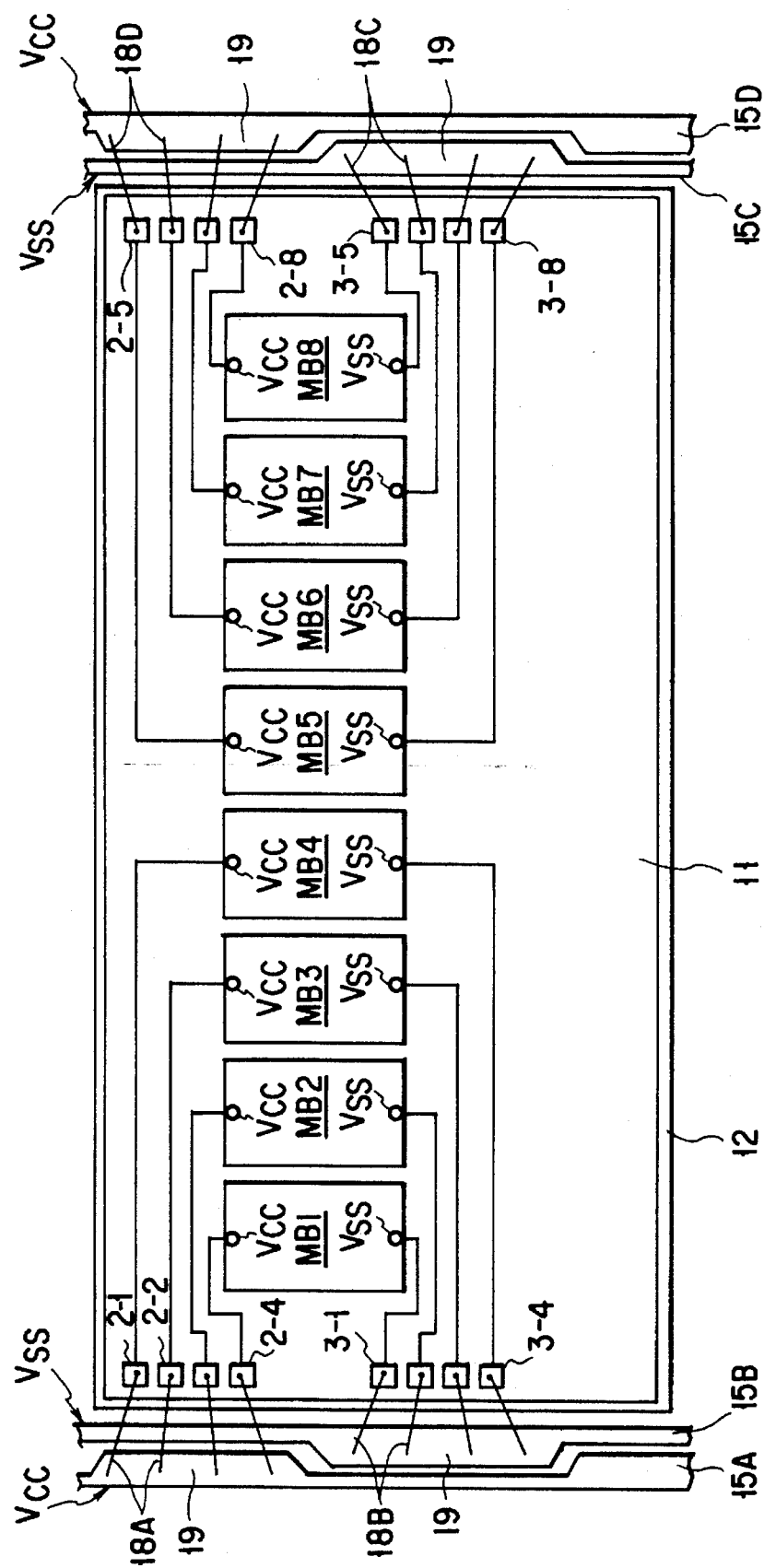
FIG. 19 is a plan view of a semiconductor device according to an eleventh embodiment of this invention.

FIG. 19 is a plan view of a semiconductor device, according to the eleventh embodiment.

As shown in FIG. 19, a plurality of wires 18A may be connected to one projection of the lead 15A and a plurality of wires 18B may be connected to one projection of the lead 15B. In this case, the high-potential power supply pads 2-1 to 2-4 and the low-potential power supply pads 3-1 to 3-4 are provided collectively, not alternately, in the chip 11.

Figure 20:
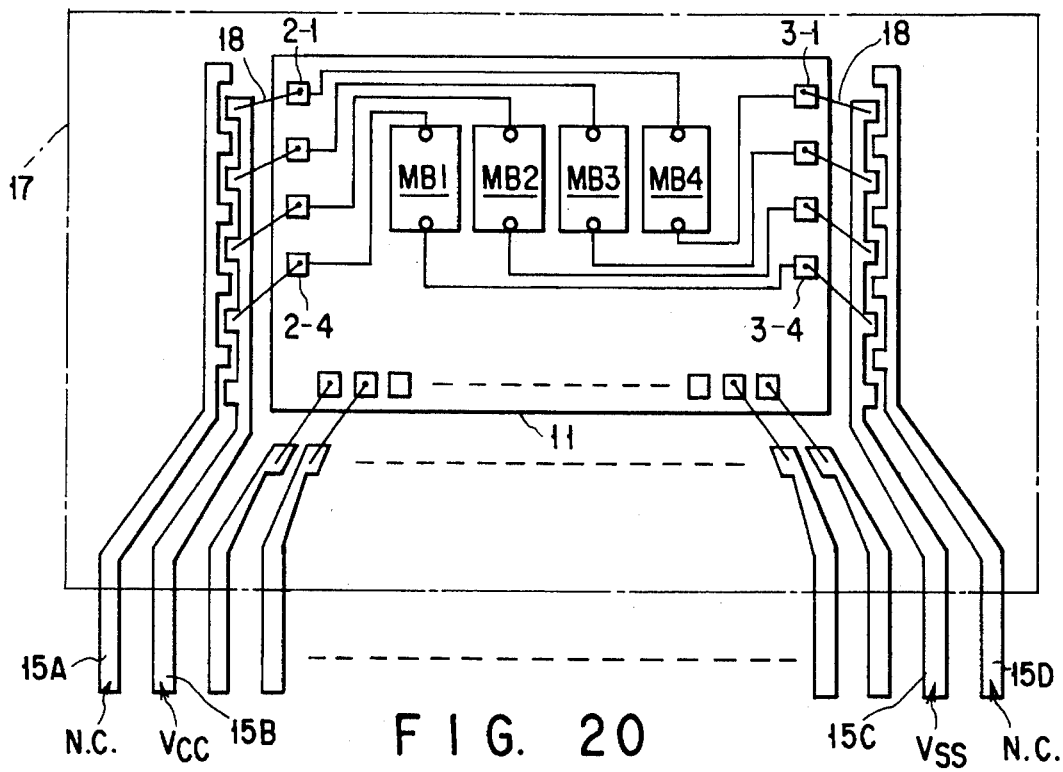
FIG. 20 is a plan view of a semiconductor device according to a twelfth embodiment of this invention.

FIG. 20 is a plan view of a semiconductor device according to a twelfth embodiment of this invention.

The device of the twelfth embodiment relates to an example of using a lead frame.

When a semiconductor device has adjoining leads 15A and 15B and adjoining leads 15C and 15D as shown in FIG. 20, the wires 18 may not be connected properly.

For example, this may occur when only the high-potential power supply pads 2-1 to 2-4 are arranged at one edge of the chip 11 and only the low-potential power supply pads 3-1 to 3-4 are located at the opposite edge.

In this case, the leads which are not used, the leads 15A ad 15D in this example, should be left unconnected (N.C.).

Figure 21:
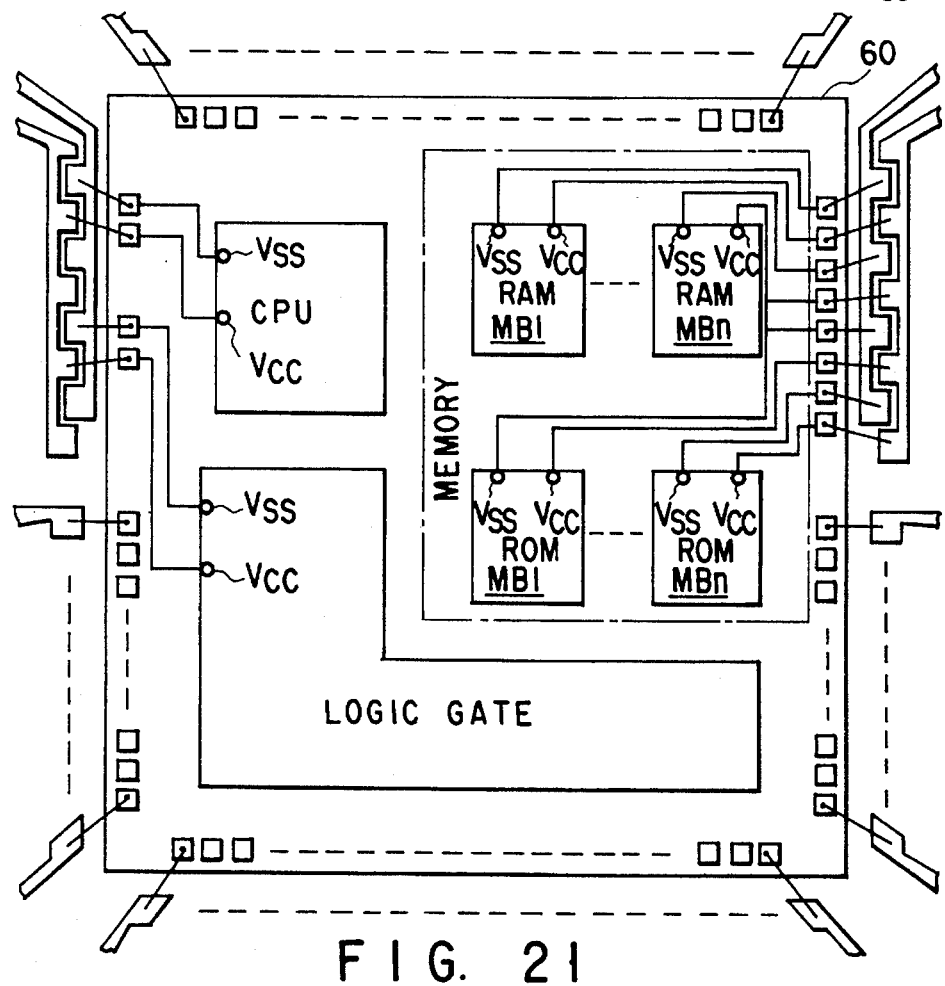
FIG. 21 is a plan view of a semiconductor device according to a thirteenth embodiment of this invention.

FIG. 21 is a plan view of a semiconductor device according to a thirteenth embodiment of this invention.

This device relates to another example of a mountable IC chip.

The chip to be mounted may be a microcomputer chip 60 with a CPU, a logic unit and memory integrated as shown in FIG. 21. In the microcomputer 60, power supplies are respectively connected to the circuit blocks.

Figure 22:
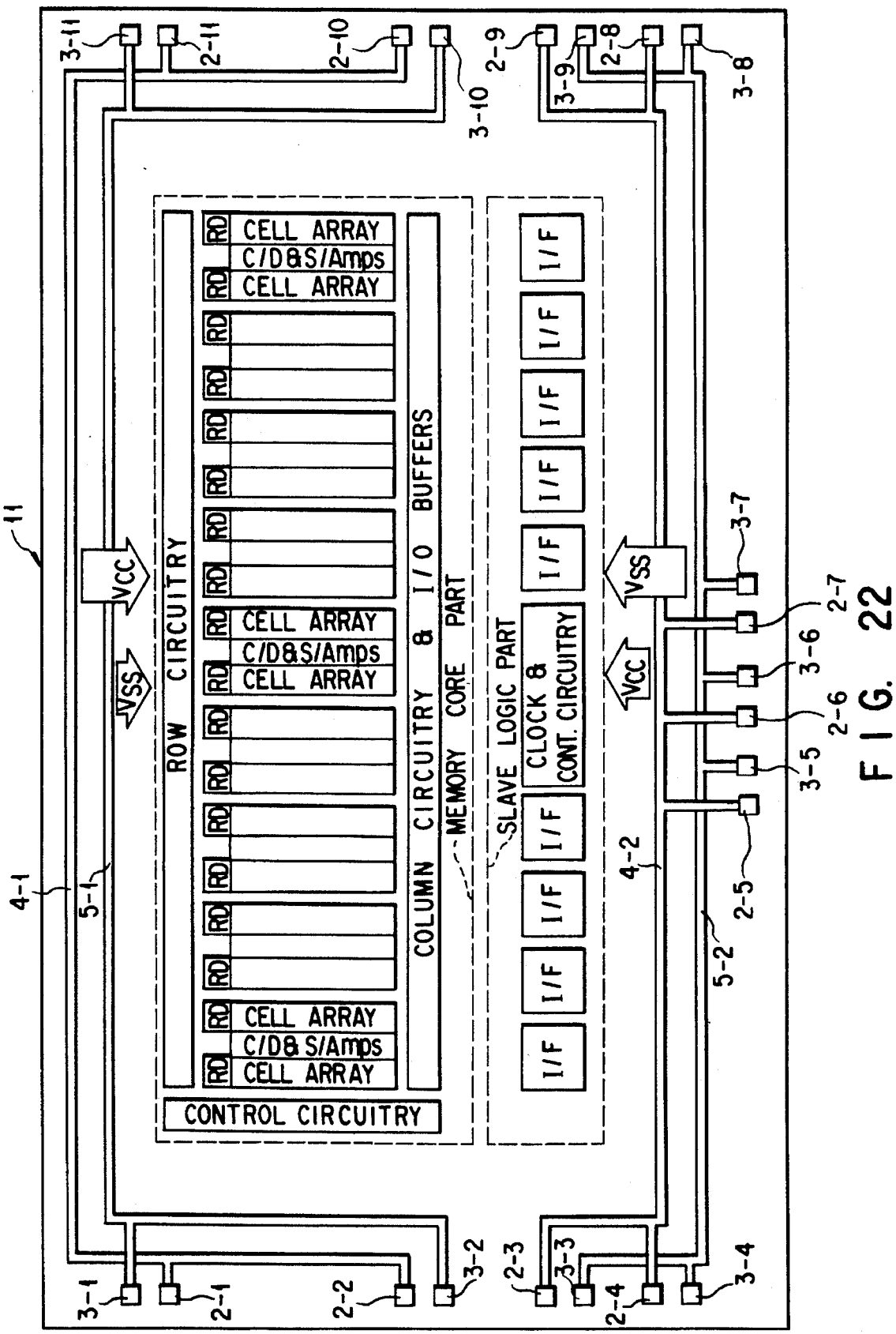
FIG. 22 is a plan view of a semiconductor chip according to a fourteenth embodiment of this invention.

FIG. 22 is a plan view of a semiconductor device according to the fourteenth embodiment of the present invention, which relates to an IC chip 11.

The IC chip 11 is a RAmbus dynamic RAM (hereinafter refereed to as "RDRAM"). As shown in FIG. 22, the RDRAM chip 11 comprises to major circuit parts. The first major circuit part is a memory core part which has the same structure as an ordinary DRAM. The second major circuit part is a slave (interface) logic part which functions as an interface connected to the memory core part. The the RDRAM chip 11 differs from an ordinary DRAM in that it has a slave logic part.

The memory core part, i.e., the first major circuit part, includes a plurality of memory blocks (9 blocks shown in FIG. 22). Each memory block comprises two memory cell arrays (18 arrays shown in FIG. 22), two row decoder (RD), each provided for one memory cell array, two sense amplifiers (S/Amp), each used for one memory cell array, and one column decoder (C/C) provided for two memory cell arrays. The memory core part further includes a memory peripheral circuitry which comprises a row circuitry, a column circuitry, and a control circuitry. The row circuitry has row address signal buffers. The column circuitry has column address signal buffers. The control circuitry has an input and output (I/O) buffers, a counter circuit, a data refresh circuit and the like.

The slave logic part, i.e., the second major circuit part, includes interface (I/F) circuits, each provided for one memory block, clock circuits, and a control (CONT.) circuit for controlling the operating timing of the interface circuits.

The RDRAM chip 11 incorporates power supplies of the type shown in FIG. 2, each provided for each memory block included in the memory core part, and an independent power supply provided for the slave logic part. The RDRAM chip 11 has a lead frame of the type shown in the FIG. 1. Having these power supplies and the lead frame, the RDRAM scarcely makes errors, has a small number of pins, and can be manufactured in the form of a small package.

FIG. 22 also illustrates another type of a power supply system. More specifically, the memory core part has one VCC power supply rail 4-1 and one VSS power supply rail 5-1, rather than having a power supply for one memory block. A plurality of pads are connected to the power supply rail 4-1, and a plurality of pad are connected to the power supply 5-1. The power supply rail 4-1 is therefore electrically connected, at any parts, to the VCC leads and VSS leads. Similarly, the power supply rail 4-1 is therefore electrically connected, at any parts, to the VCC leads and VSS leads. Potential fluctuation can thereby be prevented in both power supply rails 4-1 and 5-1, as in a chips wherein a power supply is provided for one memory block.

In the RDRAM of FIG. 22, pads 2-5 to 2-7 are connected to a power supply rail 4-2, and pads 3-5 to 3-7 are connected to a power supply rail 5-2—all contratedly in the vicinity of a clock and control circuitry. The clock and control circuitry controls high-speed data transfer performed at a rate of, for example, 500 mega bytes per second, and many make errors even if the power-supply potential changes only a little. Although the clock and control circuitry is very sensitive electrically, it scarcely make error since the VCC leads and VSS leads are connected to the power supply rails 4-2 and 5-2, contratedly near this electrically sensitive circuitry.

According to semiconductor devices of the above-described embodiments, the power supplies are provided separately for the respective circuit blocks, thus accomplishing an equivalent circuit having a single circuit block connected in series between power supplies. This will overcome the conventional problem of varying the combined resistance due to the parallel connection, suppressing a variation in supply voltage to reduce the possibility of causing malfunction. Thus, the IC chip less malfunctions and has an improved reliability.

Further, the leads which are shared by a plurality of circuit blocks and run parallel to each other, e.g., the leads 15A and 15B, each have recesses and projections formed continuously, the recesses and projections of the former lead being engaged with the projections and recesses of the latter lead. The bonding area 19 is provided on each projection. This structure can reduce the planar area for the bonding areas more than the parallel running of two leads wide over the entire length. This structure can contribute to reducing the package size.

The provision of the insulating layer 30 on the lead 15B, for example, which runs parallel to the lead 15A and is adjacent to the chip 11, as in the device shown in FIGS. 9A to 9C will prevent the wire 18A bonded to the lead 15A from contacting the lead 15B, thus achieving an improved reliability. Further, the yield can be improved as well.

By setting the top surface of the lead 15B excluding the projections lower than the top surfaces of the projections (bonding areas) 19 as in the devices shown in FIGS. 11 to 16, the wire 18A bonded to the lead 15A can be prevented from contacting the lead 15B, thus achieving an improved reliability. Further, the yield can be improved as well.

With the employment of the lead shape as in the device shown in FIGS. 17A and 17B, the bonding positions can be set nearly on a single imaginary line 32. If the bonding positions are sent on a single imaginary lien 32 and the bonding positions of the leads 15A and 15B match with each other, the loop heights of the wires 18 can be made nearly the same, thus preventing unnecessary wire contact to the leads. Thus, the reliability will be improved as per the fourth and fifth embodiments. The yield can also be improved. Further, the wires 18A and 18B will have nearly the same length, the fabrication will be accomplished easily and efficiently. The uniform length of the wires 18A and 18B may be achieved by shifting the pad positions in the chip as done in the device shown in FIGS. 18A and 18B.

The present invention is not limited to the above-described embodiments, but may be modified in various other forms without departing from the spirit and scope of the invention.

Instead of using a mold resin to seal the chip 11, a ceramic package may be used.

In short, this invention will provide a semiconductor device whose pins will not be increased unnecessarily, which can be housed in a small package, and which incorporates a highly reliable semiconductor chip hat hardly malfunctions.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:

a semiconductor chip having a plurality of sides and including at least first, second, third and fourth pads serving as outer electrodes;

a first lead member having a portion extending substantially parallel to one of said plurality of sides, said first lead member having a plurality of projections and recesses;

a second lead member located adjacent to said first lead member and farther from the outer electrodes than the first lead member, said second lead member having a plurality of projections each of which projects into a corresponding one of the plurality of recesses of said first lead member and having a plurality of recesses, wherein each of the projections of said first lead member projects into a corresponding one of the plurality of recesses of said second lead member;

a first connection member for electrically connecting said first lead member to said first pad, said first connection member being connected to one of said projections of said first lead member;

a second connection member for electrically connecting said second lead member to said second pad, said second connection member traversing the first lead member and being connected to one of said projections of said second lead member;

a third connection member for electrically connecting said first lead member to said third pad, said third connection member being connected to another projection of said first lead member; and a fourth connection member for electrically connecting said second lead member to said fourth pad, said fourth connection member traversing the first lead member and being connected to another projection of said second lead member.

2. A semiconductor device according to claim 1, wherein at least said second connection member extends over said first lead member to electrically connect said second lead member to said second pad.

3. A semiconductor device according to claim 2, further comprising an insulating member provided at least on a portion of said first lead member over which said second connection member extends.

4. A semiconductor device according to claim 2, wherein at least a top surface of a portion of said first lead member over which said second connection member extends is located on one side of a plane formed by a top surface of said second lead member and said second connection member is located on the other side of the plane.

5. A semiconductor device according to claim 2, wherein a connecting point between said projection of said first lead member and said first connection member and a connecting point between said projection of said second lead member and said second connection member are positioned on an imaginary straight line.

6. A semiconductor device according to claim 1, wherein said first, second, third and fourth pads are power supply pads.

7. A semiconductor device according to claim 6, wherein said first and third pads are low-potential power supply pads to be supplied with a low potential and said second and fourth pads one high-potential power supply pads to be supplied with a high potential.

8. A semiconductor device according to claim 7, wherein said first, second, third and fourth pads are arranged along one of said plurality of sides of said chip.

9. A semiconductor device according to claim 8, wherein said first, second, third and fourth pads are arranged along one of said plurality of sides of said chip, and said high-potential power supply pads and said low-potential power supply pads are alternately arranged.

10. A semiconductor device according to claim 8, wherein said first, second, third and fourth pads are arranged along one of said plurality of sides of said chip, and said high-potential power supply pads and said low-potential power supply pads are collectively arranged in separate areas.

11. A semiconductor device according to claim 8, wherein said first, second third and fourth pads are arranged along one of said plurality of sides of said chip, and said high-potential power supply pads and said low-potential pads are staggered.

12. A semiconductor device according to claim 1, wherein said chip is a semiconductor integrated circuit chip.

13. A semiconductor device according to claim 12, wherein said semiconductor integrated circuit chip incorporates a plurality of circuit blocks having predetermined functions.

14. A semiconductor device according to claim 13, wherein said first, second, third and fourth pads are power supply pads for individually supplying operation supply voltages to said plurality of circuit blocks.

15. A semiconductor device according to claim 14, wherein said first and third pads are low-potential power supply pads to be supplied with a low potential and said second and fourth pads are high-potential power supply pads to be supplied with a high potential.

16. A semiconductor device according to claim 15, wherein said first and second pads are electrically connected to one of said plurality of circuit blocks and said third and fourth pads are electrically connected to another one of said plurality of circuit blocks.

17. A semiconductor device according to claim 16, wherein said plurality of circuit blocks are memory circuit blocks.

18. A semiconductor device according to claim 17, wherein said memory circuit blocks are memory circuit blocks of a dynamic type.

19. A semiconductor device according to claim 1, further comprising packing means for packing at least said chip to isolate said chip from outside.

20. A semiconductor device according to claim 19, wherein said a part of said first lead member and a part of said second lead member are led out of said packing means in a same direction.

21. A semiconductor device according to claim 19, wherein said a part of said first lead member and a part of said second lead member are led out of said packing means in opposite directions.

22. A semiconductor device according to claim 19, wherein said packing means is a molding resin.

23. A semiconductor device according to claim 1, wherein said first lead member and said second lead member are positioned on a same plane.

24. A semiconductor device according to claim 23, wherein said first lead member and said second lead member are made of a single lead frame.

25. A semiconductor device comprising:

a semiconductor chip having a plurality of sides and including at least first, second, third and fourth pads serving as outer electrodes;

a first lead member having a portion extending substantially parallel to one of said plurality of sides, said first lead member having at least one projection and at least one recess;

a second lead member located adjacent to said first lead member and farther from the outer electrodes than the first lead member, said second lead member having at least one projection which projects into said at least one recess of said first lead member and having at least one recess, wherein said at least one projection of said first lead member projects into the at least one recess of the second lead member;

a first connection member for electrically connecting said first lead member to said first pad, said first connection member being connected to said at least one projection of said first lead member;

a second connection member for electrically connecting said second lead member to said second pad, said second connection member traversing the first lead member and being connected to said at least one projection of said second lead member;

a third connection member for electrically connecting said first lead member to said third pad, said third connection member being connected to said at least one projection of said first lead member; and a fourth connection member for electrically connecting said second lead member to said fourth pad, said fourth connection member traversing the first lead member and being connected to said at least one projection of said second lead member.

26. A semiconductor device comprising:

a semiconductor chip having a plurality of sides and including at least two pads serving as outer electrodes;

a first lead member having a portion extending substantially parallel to one side of said plurality of sides, said first lead member having at least one projection and at least one recess;

a second lead member located adjacent to said first lead member and farther from the outer electrodes than the first lead member, said second lead member having at least one projection which projects into said at least one recess of said first lead member and having at least one recess, wherein said at least one projection of said first lead member projects into the at least one recess of the second lead member;

a third lead member having a portion extending substantially parallel to an opposite side of said one of said plurality of sides, said third lead member having at least one projection and at least one recess;

a fourth lead member located adjacent to said third lead member and farther from the outer electrodes than the third lead member, said fourth lead member having at least one projection which projects into said at least one recess of said third lead member and having at least one recess, wherein said at least one projection of said fourth lead member projects into the at least one recess of the third lead member;

a first connection member for electrically connecting said first lead member to a first pad of said at least two pads, said first connection member being connected to said projection of said first lead member; and a second connection member for electrically connecting said third lead member to a second pad of said at least two pads, said second connection member being connected to said projection of said third lead member.

27. A semiconductor device according to claim 26, wherein said first pad is located near said one side, and said second pad is located near said opposite side.

28. A semiconductor device comprising:

a semiconductor chip having a plurality of sides and including at least four pads serving as outer electrodes;

a first lead member having a portion extending substantially parallel to one side of said plurality of sides, said first lead member having at least one projection and at least one recess;

a second lead member located adjacent to said first lead member and farther from the outer electrodes than the first lead member, said second lead member having at least one projection which projects into said at least one recess of said first lead member and having at least one recess, wherein said at least one projection of said first lead member projects into the at least one recess of the second lead member;

a third lead member having a portion extending substantially parallel to an opposite side of said one of said plurality of sides, said third lead member having at least one projection and at least one recess;

a fourth lead member located adjacent to said third lead member and farther from the outer electrodes than the third lead member, said fourth lead member having at least one projection which projects into said at least one recess of said third lead member and having at least one recess, wherein said at least one projection of said third lead member projects into the at least one recess of the fourth lead member;

a first connection member for electrically connecting said first lead member to a first pad of said four pads, said first connection member being connected to one projection of said first lead member;

a second connection member for electrically connecting said third lead member to a second pad of said at least four pads, said second connection member being connected to one projection of said third lead member;

a third connection member for electrically connecting said second lead member to a third pad of said at least four pads, said third connection member traversing the first lead member and being connected to said projection of said second lead member; and a fourth connection member for electrically connecting said fourth lead member to a fourth pad of said at least four pads, said fourth connection member traversing the third lead member and being connected to said projection of said fourth lead member.

29. A semiconductor device according to claim 28, wherein said first and third pads are located along said one side, and said second and fourth pads are located along said opposite side.

30. A semiconductor device according to claim 1, wherein each of said plurality of recesses of said first lead member is located between said plurality of projections of said first lead member, and each of said plurality of recesses of said second lead member is located between said plurality of projections of said second lead member.

31. A semiconductor device according to claim 25, wherein said at least one recess of said first lead member is located adjacent to said at least one projection of said first lead member, and said at least one of the recess of said second lead member is located adjacent to said at least one projection of said second lead member.

32. A semiconductor device according to claim 26, wherein said at least one recess of said first lead member is located adjacent to said at least one projection of said first lead member, said at least one recess of said second lead member is located adjacent to said at least one projection of said second lead member, said at least one recess of said third lead member is located adjacent to said at least one projection of said third lead member, and said at least one recess of said fourth lead member is located adjacent to said at least one projection of said fourth lead member.

33. A semiconductor device according to claim 28, wherein said at least one recess of said first lead member is located adjacent to said at least one projection of said first lead member, said at least one recess of said second lead member is located adjacent to said at least one projection of said second lead member, said at least one recess of said third lead member is located adjacent to said at least one projection of said third lead member, and said at least one recess of said fourth lead member is located adjacent to said at least one projection of said fourth lead member.

34. A semiconductor device according to claim 31, wherein said first lead member has at least two projections and at least one recess located between said two projections of said first lead member, and said second lead member has at least two projections and at least one recess located between said two projections of said second lead member.

35. A semiconductor device according to claim 32, wherein said first lead member has at least two projections and at least one recess located between said two projections of said first member, said second lead member has at least two projections and at least one recess located between said two projections of said second lead member, said third lead member has at least two projections and at least one recess located between said two projections of said third lead member, and said fourth lead member has at least two projections and at least one recess located between said two projections of said fourth lead member.

36. A semiconductor device according to claim 33, wherein said first lead member has at least two projections and at least one recess located between said two projections of said first lead member, said second lead member has at least two projections and at least one recess located between said two projections of said second lead member, said third lead member has at least two projections and at least one recess located between said two projections of said third lead member, and said fourth lead member has at least two projections and at least one recess located between said two projections of said fourth lead member.

37. A semiconductor device comprising:

a semiconductor chip having a plurality of pads arranged in a row;

a first lead member having a portion extending substantially parallel to said row of said pads, said first lead member having at least first and second projections;

a second lead member located farther from the pads than the first lead member and having a portion extending between said first and second projections of said first lead member;

a first connection member for electrically connecting said first projection of said first lead member to one of the pads of said pads;

a second connection member for electrically connecting said second projection of said first lead member to another pad of said pads; and a third connection member traversing the first lead member for electrically connecting said extending portion of said second lead member to yet another pad of said pads, said third connection member crossing said first lead member so as to connect said extending portion of said second lead member and said yet another pad of said pads.

38. A semiconductor device according to claim 37, wherein said third connection member crosses over a crossed portion of said first lead member and the crossed portion is provided with at least an insulation film.

39. A semiconductor device according to claim 37, wherein a distance between a surface of said crossed portion of said first lead member and said third connection member is greater than any distance between surface portions of said first and second projections of said first lead member.

40. A semiconductor device according to claim 37, wherein a first connecting point that connects said first connection member and said first projection, a second connecting point that connects said second connection member and said second projection, and a third connecting point that connects said third connection member and said extending portion of said second lead member are all in an imaginary straight line.

41. A semiconductor device comprising:

a bed;

a semiconductor chip on said bed;

a package packaging said bed and chip;

a first lead member having one end located out of said package and another end located in said package, said first lead member including a first extending portion extending substantially in parallel with a first side portion of said chip, and at least one first projected portion projecting from said first extending portion to said first side portion of said chip;

a second lead member having one end located out of said package and another end located in said package, said second lead member including a second extending portion located between said chip and said first lead member in said package so as to extend substantially in parallel with said first side portion of said chip, and at least one second projected portion projecting from said second extending portion to said first extending portion of said first lead member, said first and second projected portions being offset from each other;

at least one first connection member for electrically connecting said first projected portion and at least one first power source pad which is located in said chip and to which one voltage is applied; and at least one second connection member for electrically connecting said second projected portion and at least one second power source pad which is located in said chip and to which another voltage, different from said one voltage, is applied.

42. A semiconductor device according to claim 41, further comprising:

a plurality of other lead members each having one end located out of said package and a second end located in said package, said second ends of said other lead members being alined relative to a second side portion adjacent to said first side portion of said chip; and a plurality of other connection members for electrically connecting each of a plurality of other pad-electrodes of said chip with each of said one ends of said other lead members.

43. A semiconductor device according to claim 42, wherein said other lead members include at least lead members for inputting/outputting a signal to/from said chip.

44. A semiconductor device according to claim 43, wherein said first and second lead members, said lead members for inputting/outputting, and said other lead members are inserted from an outside to an inside of said package through one face of said package.

45. A semiconductor device according to claim 44, wherein said one face of said package is located opposite to said second side portion of said chip.

46. A semiconductor device according to claim 45, wherein said package is formed of materials including resin, and said first and second connection members and said other connection members include bonding wires.

47. A semiconductor device according to claim 41, wherein only said first and second lead members are in a region between said first side portion of said chip and a first side portion of said package, said first side portion of said package being parallel to said first side portion of said chip.

48. A semiconductor device according to claim 41, further comprising:

a third lead member having one end located out of said package and another end located in said package, said third lead member including a third extending portion extending substantially in parallel with a third side portion opposite to a first side portion of said chip, and at least one third projected portion projecting from said third extending portion to said third side portion of said chip;

a fourth lead member having one end located out of said package and another end located in said package, said fourth lead member including a fourth extending portion located between said chip and said third lead member in said package so as to extend substantially in parallel with said third side portion of said chip, and at least one fourth projected portion projecting from said fourth extending portion to said third extending portion of said third lead member, said third and fourth projected portions being offset from each other;

at least one third connection member for electrically connecting said third projected portion and at least one third power source pad which is located in said chip and to which one voltage is applied; and at least one fourth connection member for electrically connecting said fourth projected portion and at least one fourth power source pad which is located in said chip and to which another voltage is applied.

49. A semiconductor device according to claim 48, further comprising:

a plurality of other lead members each having one end located out of said package and a second end located in said package, said second ends of said other lead members being alined in relation to a second side portion between said first and third side portions of said chip; and a plurality of other connection members for electrically connecting each of a plurality of other pad electrodes of said chip with each of said one ends of said other lead members.

50. A semiconductor device according to claim 49, wherein said other lead members include at least lead members for inputting/outputting a signal to/from said chip.

51. A semiconductor device according to claim 50, wherein said first, second, third, and fourth lead members, said lead members for inputting/outputting, and said other lead members are inserted from an outside to an inside of said package through one face of said package.

52. A semiconductor device according to claim 51, wherein said one face of said package is located opposite to said second side portion of said chip.

53. A semiconductor device according to claim 52, wherein said package is formed of materials including resin, and said first, second, third, and fourth connection members and said other connection members include bonding wires.

54. A semiconductor device according to claim 48, wherein only said first and second lead members are in a region between said first side portion of said chip and a first side portion of said package, said first side portion of said package being parallel to said first side portion of said chip, and only said third and fourth lead members are in a region between said third side portion of said chip and a second side portion of said package, said second side portion of said package being parallel to said third side portion of said chip.

* * * * *